US010559515B2

(12) United States Patent
Sato

(10) Patent No.: US 10,559,515 B2
(45) Date of Patent: Feb. 11, 2020

(54) ELECTRONIC DEVICE

(71) Applicant: FUJITSU LIMITED, Kawasaki-shi, Kanagawa (JP)

(72) Inventor: Yoichi Sato, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 202 days.

(21) Appl. No.: 15/724,904

(22) Filed: Oct. 4, 2017

(65) Prior Publication Data

US 2018/0131056 A1 May 10, 2018

(30) Foreign Application Priority Data

Nov. 4, 2016 (JP) ................................ 2016-216284

(51) Int. Cl.
| H01L 23/367 | (2006.01) |
| G06F 1/20 | (2006.01) |
| H05K 7/20 | (2006.01) |
| H01L 23/467 | (2006.01) |
| F28F 13/06 | (2006.01) |
| F28D 15/02 | (2006.01) |

(52) U.S. Cl.
CPC ...... *H01L 23/3672* (2013.01); *F28D 15/0233* (2013.01); *F28F 13/06* (2013.01); *G06F 1/20* (2013.01); *H01L 23/467* (2013.01); *H05K 7/20145* (2013.01); *H05K 7/20727* (2013.01); *H05K 7/20736* (2013.01)

(58) Field of Classification Search
CPC .. H05K 7/20736; H05K 7/20145; G06F 1/20; F28F 13/06; F28D 15/0233
USPC ............................................ 361/690; 429/82
See application file for complete search history.

(56) References Cited

U.S. PATENT DOCUMENTS

| 2012/0057302 A1* | 3/2012 | Wei .................... H05K 7/20781 361/699 |
| 2013/0027881 A1* | 1/2013 | Goto ....................... G06F 1/203 361/697 |
| 2013/0160984 A1* | 6/2013 | Cash ......................... G06F 1/20 165/200 |
| 2016/0249479 A1* | 8/2016 | Kanasaki ........... H05K 7/20736 |
| 2018/0249590 A1* | 8/2018 | Hayashi ................ H05K 7/202 |

FOREIGN PATENT DOCUMENTS

| JP | S56-148898 | 11/1981 |
| JP | S58-153398 | 9/1983 |
| JP | S60-11840 | 3/1985 |

* cited by examiner

*Primary Examiner* — Amanda C. Walke
(74) *Attorney, Agent, or Firm* — Fujitsu Patent Center

(57) ABSTRACT

An electronic device includes a first electronic component, a substrate on which the first electronic component is mounted, which includes an additional region formed on one side of the first electronic component in a first direction for adding a second electronic component, and onto which cooling air flows, and a wall member partially surrounding the additional region, wherein the wall member includes one opening for allowing the air to flow over the additional region.

12 Claims, 40 Drawing Sheets

ELECTRONIC DEVICE

CROSS-REFERENCE TO RELATED APPLICATION

This application is based upon and claims the benefit of priority of the prior Japanese Patent Application No. 2016-216284, filed on Nov. 4, 2016, the entire contents of which are incorporated herein by reference.

FIELD

The embodiment discussed herein is related to an electronic device.

BACKGROUND

There is known a technique of restricting a flow rate of cooling air flowing to a low heat generation component by erecting a flat plate having a through-hole on a substrate on which the low heat generation component and a high heat generation component are mounted.

However, with the technique in the related art as described above, it is not assumed that additional electronic components are to be added later, and it is not possible to add electronic components later. If an electronic component is added later on a substrate on which electronic components (already mounted electronic components) are already mounted, the supply flow rate of the cooling air to the existing electronic components significantly changes due to the addition of the electronic components.

The followings are reference documents.
[Document 1] Japanese Examined Patent Application Publication No. 60-11840 and
[Document 2] Japanese Laid-open Patent Publication No. 58-153398.

SUMMARY

According to an aspect of the invention, an electronic device includes a first electronic component, a substrate on which the first electronic component is mounted, which includes an additional region formed on one side of the first electronic component in a first direction for adding a second electronic component, and onto which cooling air flows, and a wall member partially surrounding the additional region, wherein the wall member includes one opening for allowing the air to flow over the additional region.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Each example is described in detail below with reference to the attached drawings.

Example 1

Figure 1:
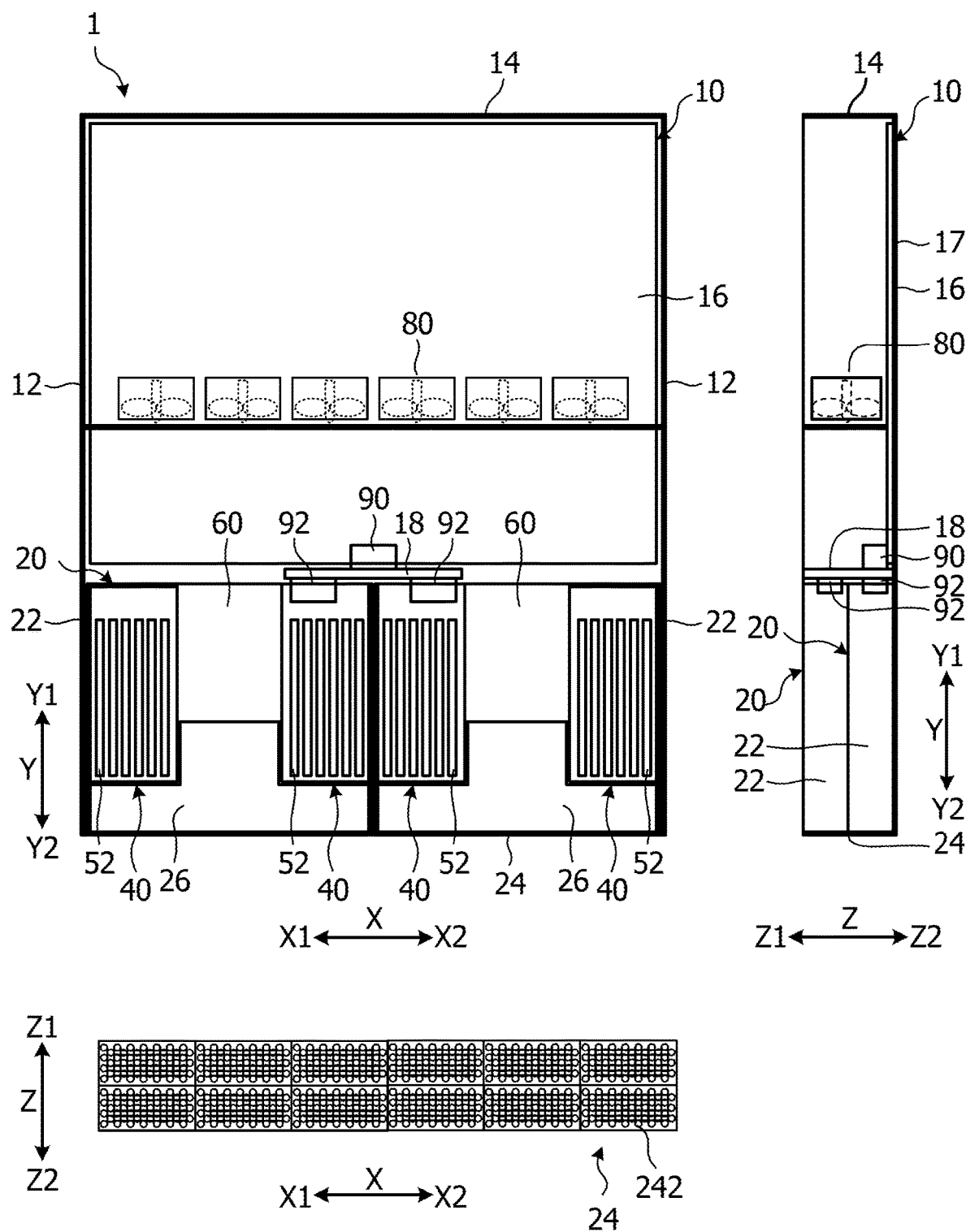
FIG. 1 is a three-sided view schematically illustrating an electronic device according to example 1.
Figure 2:
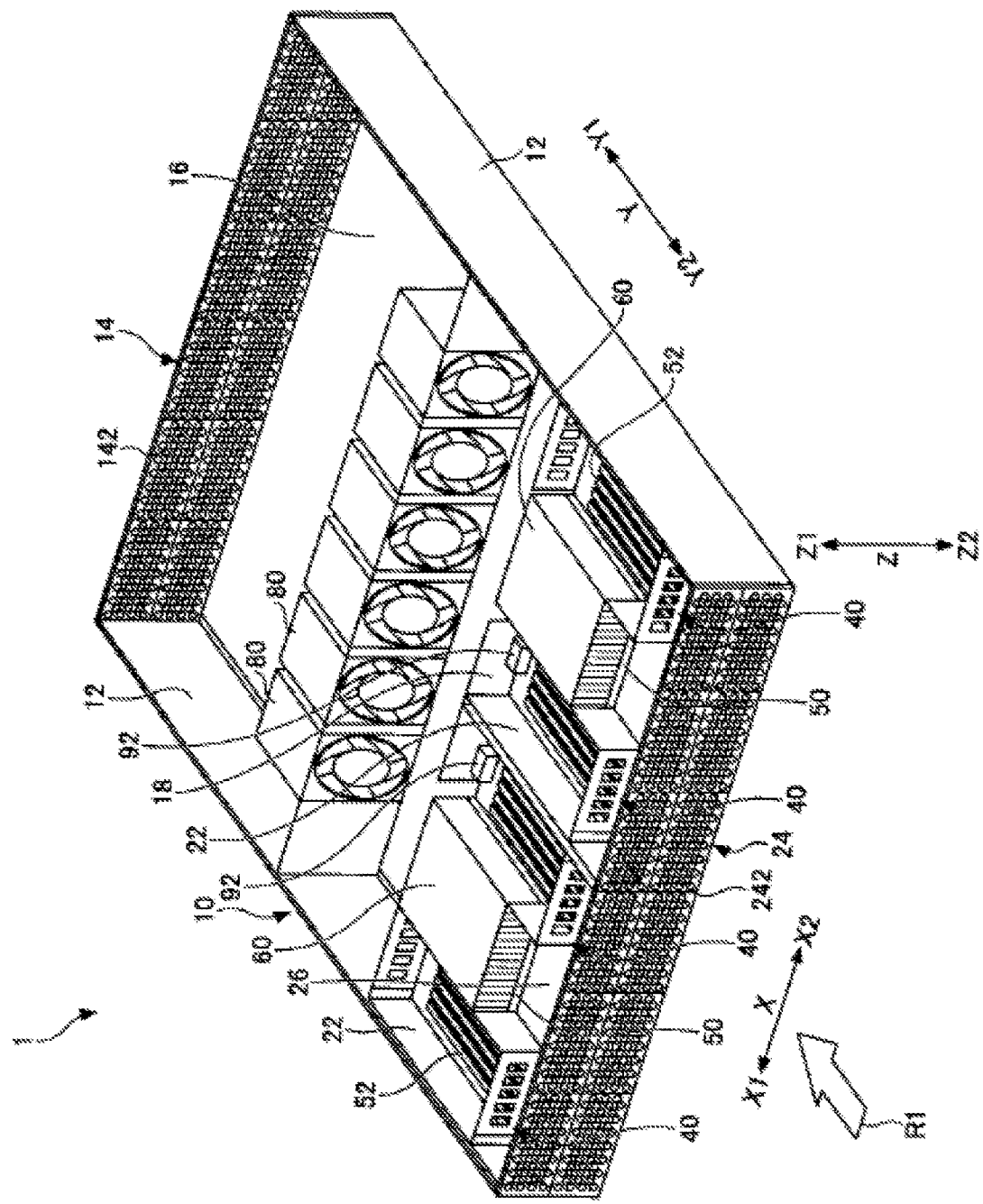
FIG. 2 is a perspective view of the electronic device.
Figure 3:
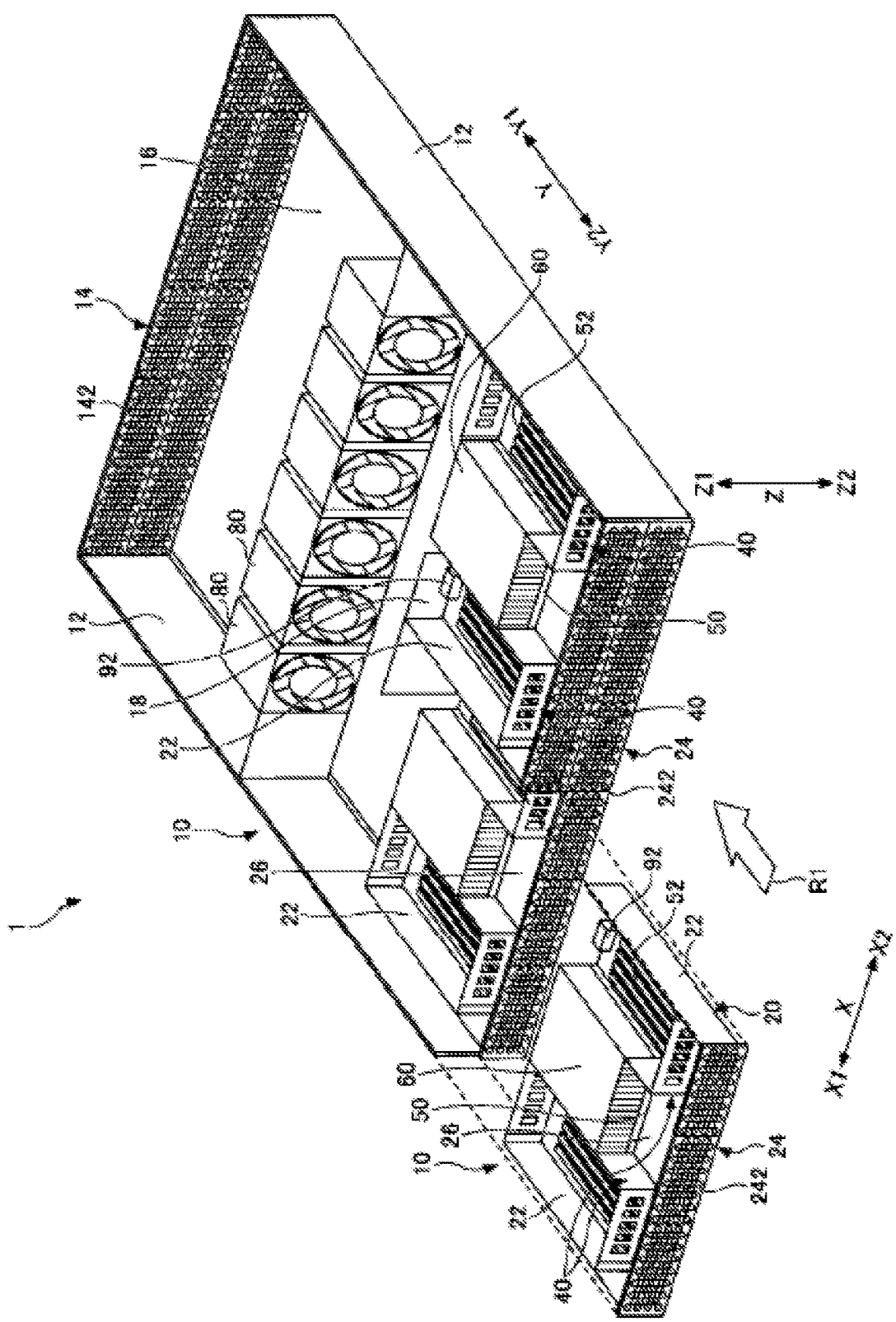
FIG. 3 is a partially disassembled perspective view of the electronic device.

FIG. 1 is a three-sided view schematically illustrating an electronic device 1 according to example 1. FIG. 2 is a perspective view of the electronic device 1. FIG. 3 is a partially disassembled perspective view of the electronic device 1. In FIGS. 1 to 3, an interior of the electronic device 1 is illustrated through a metal plate on a top surface of a chassis 10. In addition, in a side view in FIG. 1, the interior of the electronic device 1 is illustrated through the metal plate on the side surface of the chassis 10. Further, FIG. 3 illustrates a state in which one of unit cases 20 is detached. In FIGS. 2 and 3, a flow direction of the air generated by a fan 80 is indicated by an arrow R1. In the following views, arrows R* (* is a number) schematically illustrate air flow directions.

In the following description, for the sake of description, an X axis, a Y axis, and a Z axis which are three orthogonal axes are defined as illustrated in FIG. 1. Here, as an example, it is assumed that an XY plane is a horizontal plane, a Z direction is a height direction (vertical direction), and a "Z1 side" is an "upper side". In the following description, for the sake of description, it is assumed that a "Y1 side" in a Y direction is a "rear side" and a "Y2 side" in the Y direction is a "front side". The rear side and the front side correspond to a "back side" and an "entrance side" with reference to an insertion direction of the unit case 20, respectively. In the following description, for the sake of description, it is assumed that an X direction is a horizontal direction and an "X1 side" is a "left side".

The electronic device 1 is in a form of, for example, a server. The electronic device 1 includes the chassis 10 and the unit case 20.

The chassis 10 forms a frame (framework) of the electronic device 1. The chassis 10 is in a form of a case, and a plurality of unit cases 20 are detachably inserted (accommodated). In the examples illustrated in FIGS. 1 to 3, the unit case 20 has a 2×2 configuration in which there are two rows in the vertical direction and two columns in the horizontal direction (X direction), but the method of mounting the unit case 20 is arbitrary.

The chassis 10 includes left and right side members 12, a back member 14, and a main body substrate 16. The side member 12 and the back member 14 are formed by a metal plate, for example. A bottom member 17 of the metal plate may be provided below the main body substrate 16. The side member 12, the back member 14, and the main body substrate 16 together with a top surface member (not illustrated) form an internal space in the chassis 10, and each unit case 20 and the like are accommodated using the internal space.

The side member 12 is provided with a support mechanism (not illustrated) for supporting each unit case 20. For example, the support mechanism is a rail, a support portion, or the like protruding from the side member 12.

As illustrated in FIG. 2, the back member 14 includes an exhaust hole 142 for exhaust. As illustrated in FIGS. 1 to 3, for example, a plurality of exhaust holes 142 are formed. The exhaust hole 142 penetrates the back member 14 in the Y direction and allows exhaust of air (exhaust to the outside of the chassis 10) along the flow direction R1.

The main body substrate 16 is provided on the Y1 side with respect to the accommodating space of the unit case 20. The main body substrate 16 is provided with a fan 80 (described later), another electronic device, and a circuit portion (not illustrated). The other electronic device may include, for example, a power supply unit in a form of a power supply unit (PSU), a peripheral component interconnect (PCI) card, and the like.

The chassis 10 is provided with the fan 80. As illustrated in FIGS. 1 to 3, for example, a plurality of fans 80 are mounted on the main body substrate 16. The fan 80 may be provided in plural stages also in the Z direction. In the example illustrated in FIGS. 1 to 3, the plurality of (six) fans 80 are provided side by side in the horizontal direction. In example 1, the fan 80 is provided so that the rotation axis thereof is parallel to the Y direction. Therefore, the flow direction R1 of the air generated by the fan 80 is substantially parallel to the Y direction.

The chassis 10 is provided with a backboard 18. The backboard 18 is erected on the rear side of the unit case 20. The backboard 18 is electrically connected to a circuit portion (not illustrated) on the main body substrate 16 via a connector portion 90. Further, a backboard 18 is electrically connected to the respective connector portions 92 of the unit case 20. In this way, the unit case 20 is electrically connected to a circuit portion (not illustrated) on the main body substrate 16 via the backboard 18 in the accommodated state.

Figure 4:
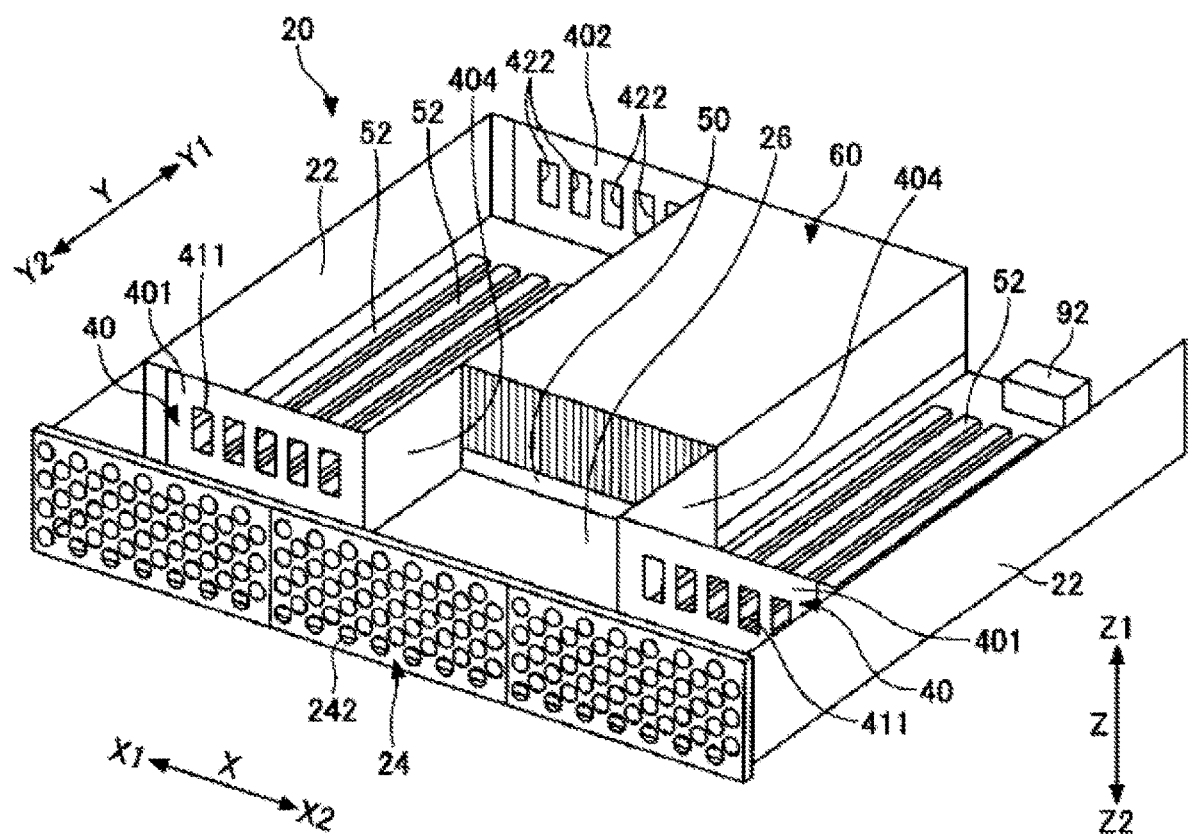
FIG. 4 is a perspective view schematically illustrating a single state of a single unit case.
Figure 5:
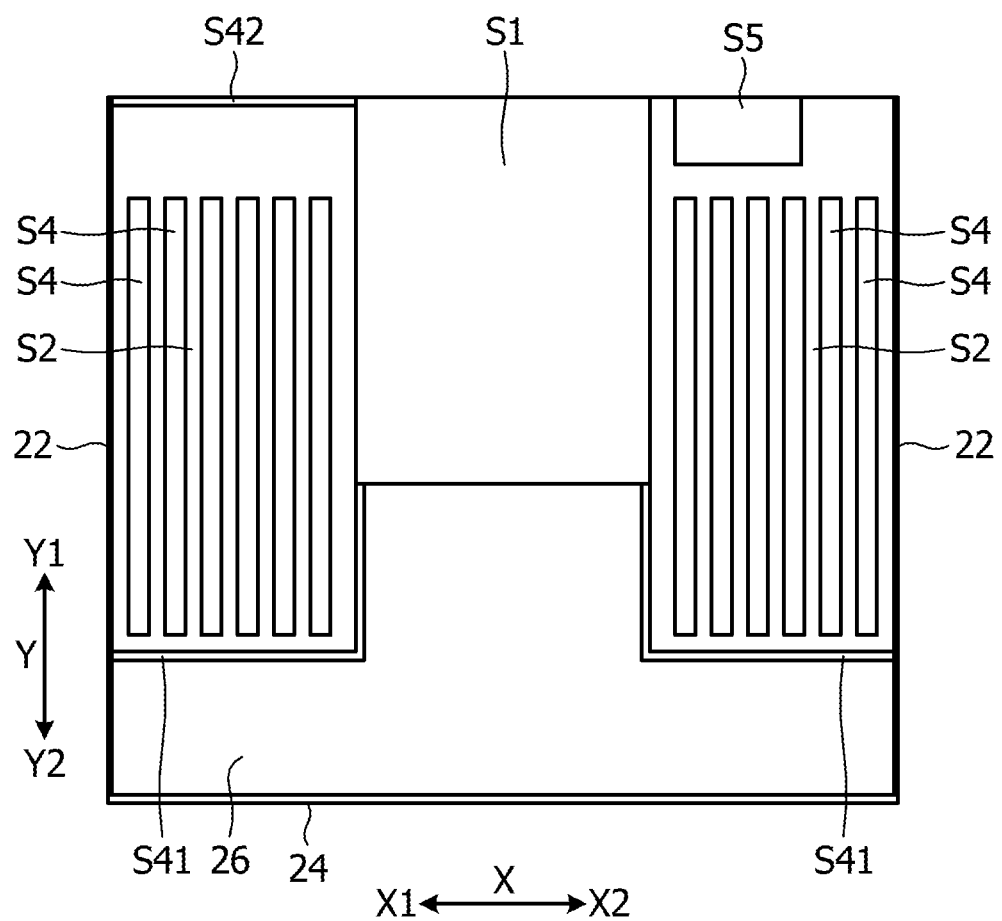
FIG. 5 is a top view schematically illustrating each region in a single substrate state.

FIG. 4 is a perspective view schematically illustrating a single state of the single unit case 20. FIG. 5 is a top view schematically illustrating each region in a single state of the substrate 26.

The single unit case 20 includes a side member 22, a front member 24, a substrate 26, a flow rate adjusting structure 40, and an electronic component 50 (an example of a first electronic component).

The side member 22 and the front member 24 are formed by a metal plate, for example.

The front member 24 includes an air intake hole 242 for air intake. As illustrated in FIGS. 1 to 3, for example, a plurality of air intake holes 242 are formed. The air intake hole 242 penetrates the front member 24 in the Y direction and allows air to be drawn in and out along the flow direction R1 (draw out to the outside of the chassis 10).

Various electronic components or circuit portions mounted in the unit case 20 are mounted on the substrate 26. The various electronic components may be, for example, a hard disk drive, a central processing unit (CPU), a large-scale integration (LSI), a memory, or the like. In example 1, as an example, the electronic component 50 is mounted on the substrate 26, and a heat sink 60 for heat dissipation is attached to the electronic component 50. The electronic component 50 is an example of an already mounted electronic component. Details of the substrate 26 are described later.

As illustrated in FIG. 5, the substrate 26 includes a first region S1 on which the electronic component 50 is mounted and a second region S2 (an example of an additional region) in which an electronic component may be added later. Hereinafter, the electronic component (an example of the second electronic component) that may be added to the second region S2 is referred to as an "additional electronic component". The additional electronic component is a predetermined electronic component (for example, an optional item) and may be, for example, a memory card or the like.

The first region S1 corresponds to the installation area (footprint) of the electronic component 50. Although the electronic component 50 is not illustrated in FIG. 5, as illustrated in FIG. 4, an electronic component 50 is mounted on the first region S1. In the example illustrated in FIG. 5, the first region S1 is set at the center in the X direction of the substrate 26, but the first region S1 may be set at an arbitrary position of the substrate 26. In the examples illustrated in FIGS. 4 and 5, one first region S1 is set for one substrate 26, but a plurality of first regions S1 may be set. That is, the first region S1 may be set according to the number of electronic components 50.

As illustrated in FIG. 5, the second region S2 is separated in the X direction with respect to the first region S1. That is, the second region S2 and the first region S1 do not overlap with each other in the X direction. The second region S2 may be offset in the Y direction with respect to the first region S1 or may not be offset in the Y direction. The second region S2 may be appropriately set in a region other than the first region S1 of the electronic component 50 in the substrate 26, for example. In the example illustrated in FIG. 5, the second region S2 is set on both sides of the first region S1 in the X direction. The number of the second regions S2 is arbitrary, and may be one for one substrate 26, or three or more may be set for one substrate.

In the second region S2, a connector 52 for the additional electronic component is provided. Instead of the connector 52, a conductor pattern may be formed in the second region S2. For example, as illustrated in FIG. 4, the connector 52 is in a form elongated in the Y direction, and a plurality of the connectors 52 are provided side by side in the X direction. In FIG. 5, the installation area S4 for the connector 52 is illustrated. In addition, in FIG. 5, the installation area S5 of the connector portion 92 is illustrated. In FIG. 5, the installation area S41 of a front wall portion 401 and a side wall portion 404 of the flow rate adjusting structure 40 to be described later is illustrated. In addition, in FIG. 5, an installation area S42 of a rear wall portion 402 of the flow rate adjusting structure 40 to be described later is illustrated.

The flow rate adjusting structure 40 includes a function of acting on the air introduced into the unit case 20 in the chassis 10 via the air intake hole 242 and not significantly changing the flow rate of the air supplied to the electronic component 50 before and after the additional electronic component 70 is added (to be described later).

The flow rate adjusting structure 40 includes a wall member that at least partially surrounds the second region S2. The wall member is provided in such a manner as to be resistant to the air introduced into the unit case 20 in the chassis 10 via the air intake hole 242. That is, the wall member is in a form perpendicular to the substrate 26 (for example, in a form of a wall).

In the example illustrated in FIG. 4, for the flow rate adjusting structure 40 relating to the second region S2 on the X1 side in the X direction, the wall member includes the front wall portion 401 (an example of a first wall portion), the rear wall portion 402 (another example of the first wall portion), the side wall portion 404 (an example of a second wall portion), and a side member 22 (an example of the second wall portion).

Further, in the example illustrated in FIG. 4, for the flow rate adjusting structure 40 relating to the second region S2 on the X2 side in the X direction, the wall member includes the front wall portion 401 (an example of the first wall portion), the side wall portion 404 (an example of the second wall portion), and the side member 22 (an example of the second wall portion).

In the example illustrated in FIG. 4, the front wall portion 401, the rear wall portion 402, and the side wall portion 404 are provided (erected) on the substrate 26. The front wall portion 401, the rear wall portion 402, and the side wall portion 404 may be a sheet metal member or may be formed of another material such as a resin material or the like. In the example illustrated in FIG. 4, the front wall portion 401 and the side wall portion 404 are formed of an integral member.

The front wall portion 401 is provided on the front side (the Y2 side in the Y direction) of the second region S2. The front wall portion 401 includes a through-hole 411 (an example of the opening) through which air flows on the second region S2. The through-hole 411 includes a function of allowing air to pass from the Y2 side to the Y1 side in the Y direction. The through-hole 411 may be formed in an arbitrary manner, and the number, shape, position, and the like are arbitrary. In addition, instead of the through-hole 411, a cutout may be used. A preferable form of the through-hole 411 is described later.

The front wall portion 401 is provided at such a position that the through-hole 411 is not blocked by the additional electronic component that may be mounted on the second region S2. That is, the front wall portion 401 is provided so as to be offset toward the Y2 side in the Y direction with respect to the additional electronic component mounted on the second region S2. In a case where the shape of additional electronic component is predetermined, based on the shape, a gap ΔY (see FIG. 16) between the front wall portion 401 and the additional electronic component (an additional electronic component in a case of being mounting on the second region S2) may be appropriately set in the Y direction.

The rear wall portion 402 is provided on the rear side (the Y1 side in the Y direction) of the second region S2. The rear wall portion 402 includes a through-hole 422 (an example of the opening) through which air flows on the second region S2. The through-hole 422 includes a function of allowing air to pass from the Y2 side to the Y1 side in the Y direction. The through-hole 422 may be formed in an arbitrary manner, and the number, shape, position, and the like are arbitrary. For example, the through-hole 422 may be formed in a pattern similar to that of the through-hole 411. That is, the through-hole 422 may be formed in a manner overlapping with the through-hole 411 when viewed in the Y direction. In addition, instead of the through-hole 422, a cutout may be used.

In example 1, as illustrated in FIG. 3, the backboard 18 provided on the rear side of the second region S2 on the X2 side in the X direction includes no through-hole like the through-hole 422 in the rear wall portion 402, but is not limited thereto. The backboard 18 may include the same through-hole as the through-hole 422 so as to perform the same function as the rear wall portion 402. In a case of not having a through-hole, the backboard 18 is formed or arranged so as not to completely block the rear side of the second region S2.

The side wall portion 404 is provided on one side of the horizontal direction of the second region S2. In the example illustrated in FIG. 4, for the flow rate adjusting structure 40 relating to the second region S2 on the X1 side in the X direction, the side wall portion 404 is provided on the right side (the electronic component 50 side in the X direction) of the second region S2. In addition, for the flow rate adjusting structure 40 relating to the second region S2 on the X2 side in the X direction, the side wall portion 404 is provided on the left side (the electronic component 50 side in the X direction) of the second region S2. The side wall portion 404 includes a function of reducing the flow rate of air that may flow into the second region S2 from between the front wall portion 401 and the electronic component 50 in the Y direction by being extended between the front wall portion 401 and the electronic component 50 in the Y direction. From the viewpoint of enhancing such function, the side wall portion 404 preferably includes no through-hole. Further, from the viewpoint of enhancing such function, the side wall portion 404 is preferably joined to the front wall portion 401 without a gap, and is formed integrally with the front wall portion 401, for example. Also, from the viewpoint of enhancing such function, the side wall portion 404 is preferably brought into contact with the electronic component 50 and the heat sink 60. Further, from the viewpoint of enhancing such function, the side wall portion 404 preferably includes substantially the same height as the height of the unit case 20.

In the example illustrated in FIG. 4, the side wall portion 404 is provided parallel to the side member 22 as a preferable example (that is, perpendicular to the front wall portion 401), but is not limited thereto. The side wall portion 404 may be provided in an inclined manner with respect to the side member 22. In this case, since the normal direction of the side wall portion 404 is not perpendicular to the Y direction, air flowing parallel to the Y direction strikes the side wall portion 404, and the side wall portion 404 become resistant to such air flow.

Further, in the example illustrated in FIG. 4, the side wall portion 404 is provided such that since there is a gap between the front wall portion 401 and the electronic component 50 in the Y direction, but is not limited thereto. In a case where there is no gap between the front wall portion 401 and the electronic component 50 in the Y direction or in a case where the gap is significantly small, the side wall portion 404 may be omitted. Further, for example, in a case where there is a gap between the rear wall portion 402 and the electronic component 50 in the Y direction, similar side wall portions (side wall portions extending between the rear wall portion 402 and the electronic component 50 in the Y direction) may be provided on the downstream side of the electronic component 50.

The side member 22 of the flow rate adjusting structure 40 is provided on the other side (the side different from the side wall portion 404) of the horizontal direction of the second region S2. In the example illustrated in FIG. 4, for the flow rate adjusting structure 40 relating to the second region S2 on the X1 side in the X direction, the side member 22 is provided on the left side of the second region S2 (a side different from the electronic component 50 side in the X direction). Further, for the flow rate adjusting structure 40 relating to the second region S2 on the X2 side in the X direction, the side member 22 is provided on the right side (the side different from the electronic component 50 side in the X direction) of the second region S2. The side member 22 of the flow rate adjusting structure 40 includes a function of reducing the flow rate of air flowing in the X direction out of the second region S2 out of the air flowing over the second region S2. From the viewpoint of enhancing such function, the side member 22 of the flow rate adjusting structure 40 preferably includes no through-hole. The side member 22 of the flow rate adjusting structure 40 is preferably joined to the front wall portion 401 without a gap from the viewpoint of enhancing such function. The side member 22 of the flow rate adjusting structure 40 preferably extends to an end portion on the rear side (the Y1 side in the Y direction) of the second region S2 from the viewpoint of enhancing such function. The side member 22 of the flow rate adjusting structure 40 preferably includes substantially the same height as the height of the unit case 20 from the viewpoint of enhancing such function.

Next, an effect of example 1 is described while comparing with various comparative examples with reference to FIG. 6 to FIG. 19.

Figure 6:
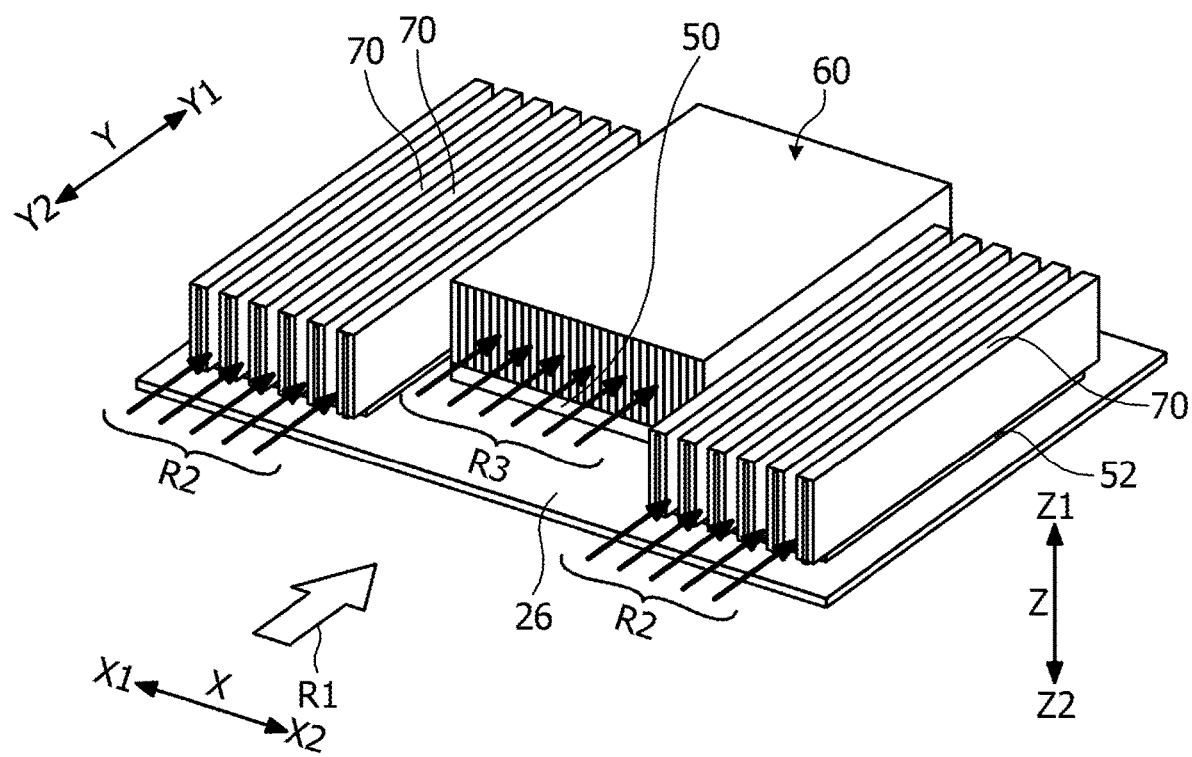
FIG. 6 is an explanatory view of an electronic device according to a first comparative example.
Figure 7:
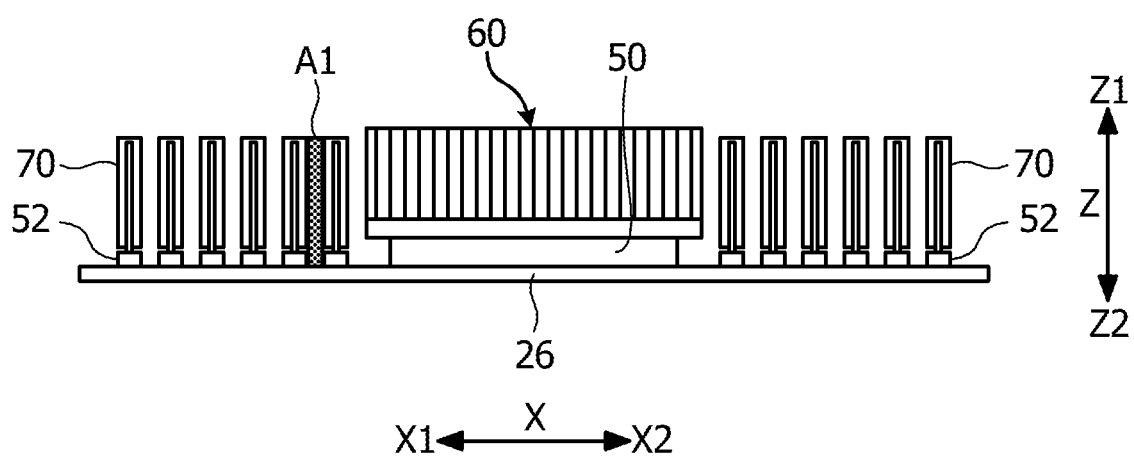
FIG. 7 is an explanatory view of the electronic device according to the first comparative example.

FIGS. 6 and 7 are explanatory views of the electronic device according to a first comparative example, FIG. 6 is a partial perspective view, and FIG. 7 is a front view. In FIGS. 6 and 7, the same reference numerals are assigned to constituent elements similar to example 1, and only the constituent elements on the substrate 26 are illustrated (also applies to other comparative examples illustrated below). In FIGS. 6 and 7, the flow of cooling air is schematically indicated by the arrows R1 to R3.

The electronic device according to the first comparative example is different from the electronic device 1 according to example 1 described above in that the front wall portion 401, the rear wall portion 402, and the side wall portion 404 are not provided. FIGS. 6 and 7 illustrate a state in which the additional electronic component 70 is mounted. In FIGS. 6 and 7, the all additional electronic components 70 are mounted on the connectors 52. That is, all the additional electronic components 70 (such as an addable memory card) are mounted on the second region S2.

Also in FIGS. 6 and 7, in the front side of the electronic device, the flow direction of the cooling air is parallel to the Y direction as indicated by the arrow R1. Cooling air flows through the gap between the additional electronic components 70 in the X direction (see the arrow R2) and flows through the heat sink 60 on the electronic component 50 (see the arrow R3). The flow rate of the air flowing in the gap between the additional electronic components 70 in the X direction is roughly determined according to the area formed by the gap between the additional electronic components 70 in the X direction (the cross-sectional area of the flow path). In FIG. 7, a cross-sectional area of a flow path formed by a gap between a pair of additional electronic components 70 is indicated by a hatching region A1. In a case of the electronic device according to the first comparative example, it is possible to set spacing and the like in the X direction of the connector 52 and the like so that the cross-sectional area of the flow path is proper by assuming that all the additional electronic components 70 are mounted. In this case, when all the additional electronic components 70 are mounted, the cooling air may be distributed to the electronic component 50 and the additional electronic components 70 at an appropriate flow rate.

Figure 8:
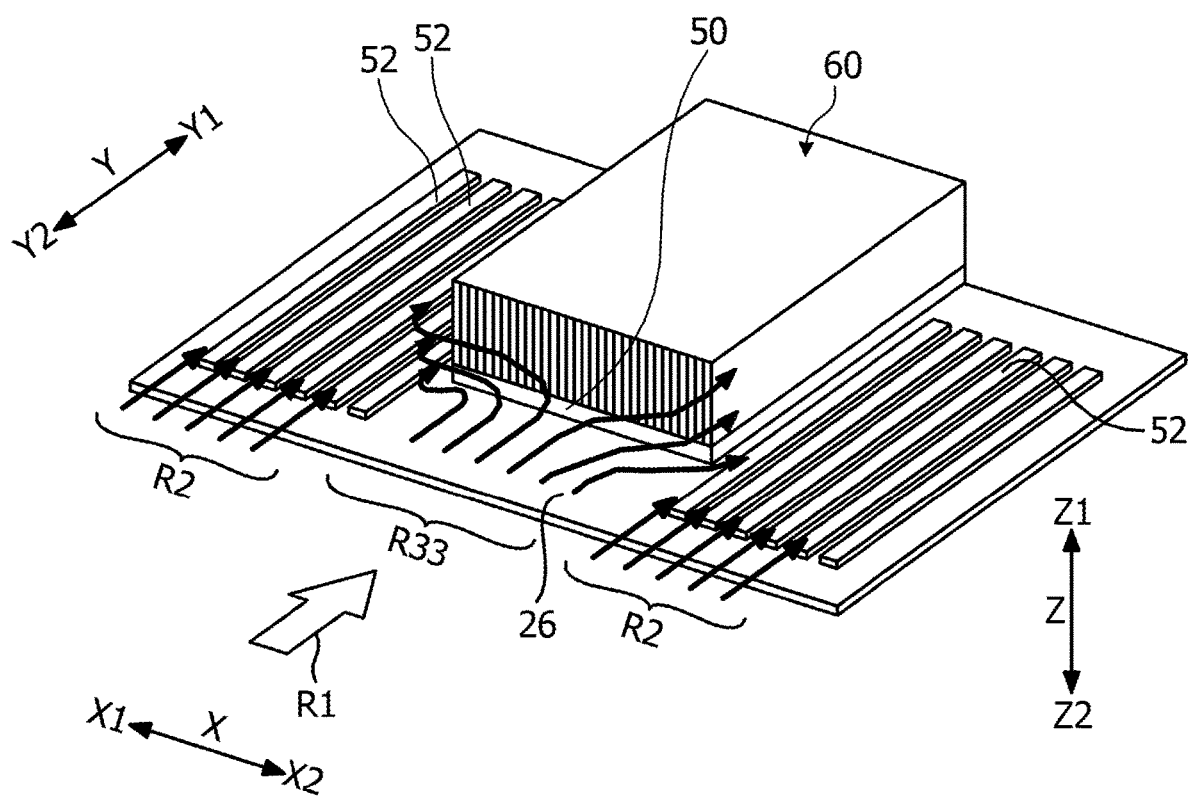
FIG. 8 is an explanatory view of the electronic device according to the first comparative example.
Figure 9:
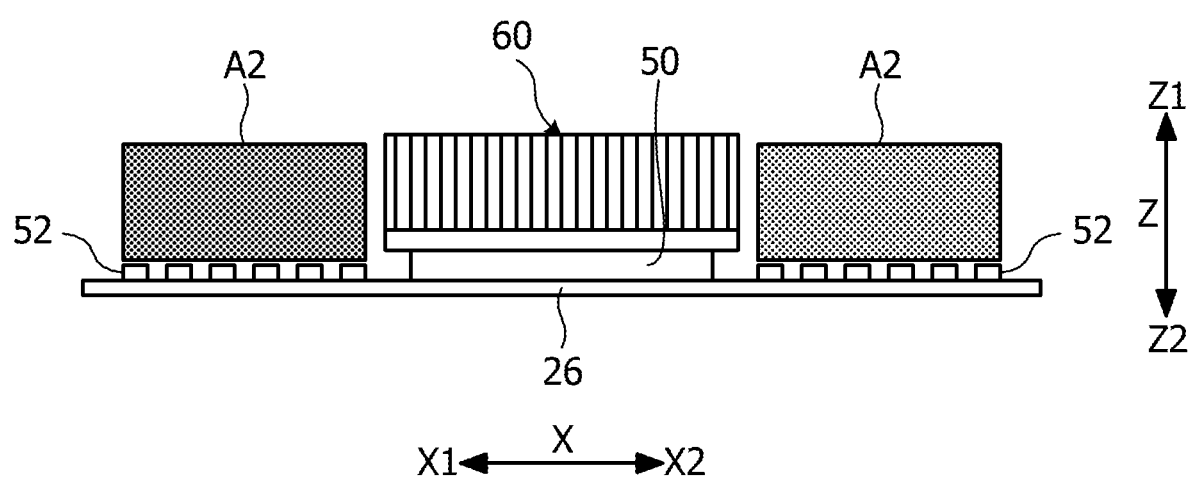
FIG. 9 is an explanatory view of the electronic device according to the first comparative example.

FIGS. 8 and 9 are explanatory views of the electronic device according to the first comparative example, FIG. 8 is a partial perspective view, and FIG. 9 is a front view. In FIGS. 8 and 9, in contrast to FIGS. 6 and 7, a state in which the additional electronic components 70 are not mounted at all is illustrated.

On the other hand, in a case of the electronic device according to the first comparative example, in the state in which the additional electronic component 70 is not mounted at all, as illustrated in FIG. 9, a flow path having a relatively large cross-sectional area is formed on the second region S2 (the cross-sectional area of the flow path is indicated by a hatching region A2). Therefore, as schematically illustrated by the arrow R33 in FIG. 8, a large part of the air directed to the heat sink 60 flows onto the second region S2 and the flow rate of the air flowing through the heat sink 60 is significantly reduced as compared with the state in which all the additional electronic components 70 are mounted (see FIGS. 6 and 7). That is, in the first comparative example, the supply flow rate of the cooling air to the existing electronic component 50 significantly changes before and after the additional electronic component 70 is added. In a case of the first comparative example, before the addition of the additional electronic component 70, the supply flow rate of the cooling air to the already mounted electronic component 50 is insufficient, and there is a possibility that the cooling of the already mounted electronic component 50 becomes insufficient.

Figure 10:
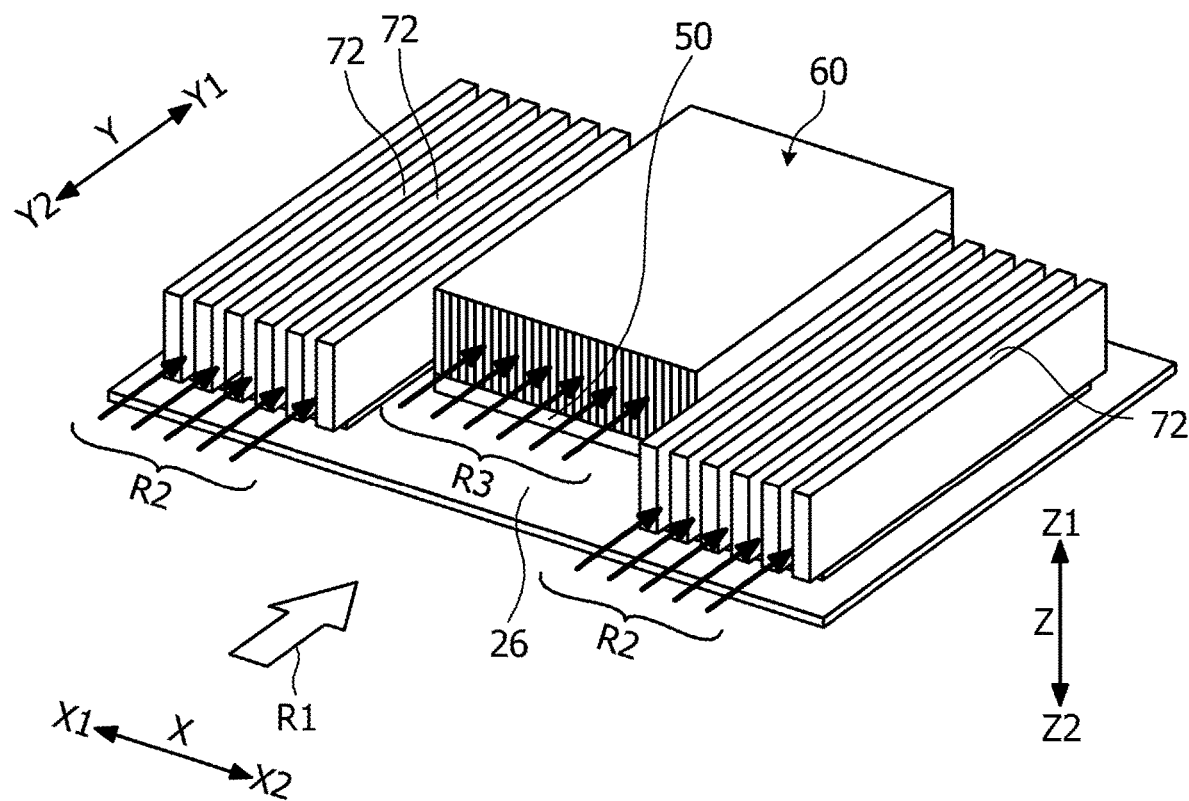
FIG. 10 is an explanatory view of an electronic device according to a second comparative example.
Figure 11:
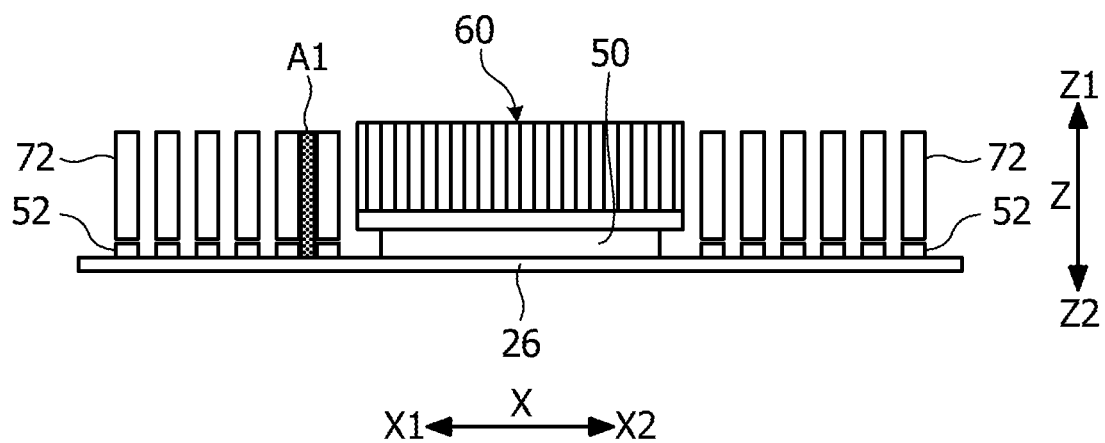
FIG. 11 is an explanatory view of the electronic device according to the second comparative example.

FIGS. 10 and 11 are explanatory views of the electronic device according to a second comparative example, FIG. 10 is a partial perspective view, and FIG. 11 is a front view.

The electronic device according to the second comparative example is different from the electronic device 1 according to example 1 described above in that the front wall portion 401, the rear wall portion 402, and the side wall portion 404 are not provided. FIGS. 10 and 11 illustrate a state in which a dummy 72 is mounted. In FIGS. 10 and 11, the dummy 72 is mounted on all the connectors 52. That is, all the dummies 72 imitating the additional electronic component 70 are mounted on the second region S2.

The dummy 72 is different from the additional electronic component 70, but is a member (a non-electronic component) having substantially the same form as the additional electronic component 70. As illustrated in FIGS. 10 and 11, the state in which all the dummies 72 are mounted is substantially the same as the state in which all the additional electronic components 70 according to the first comparative example are mounted (see FIGS. 6 and 7). Therefore, in a state in which all the dummies 72 are mounted, the cooling air may be distributed to the electronic component 50 at an appropriate flow rate.

Figure 12:
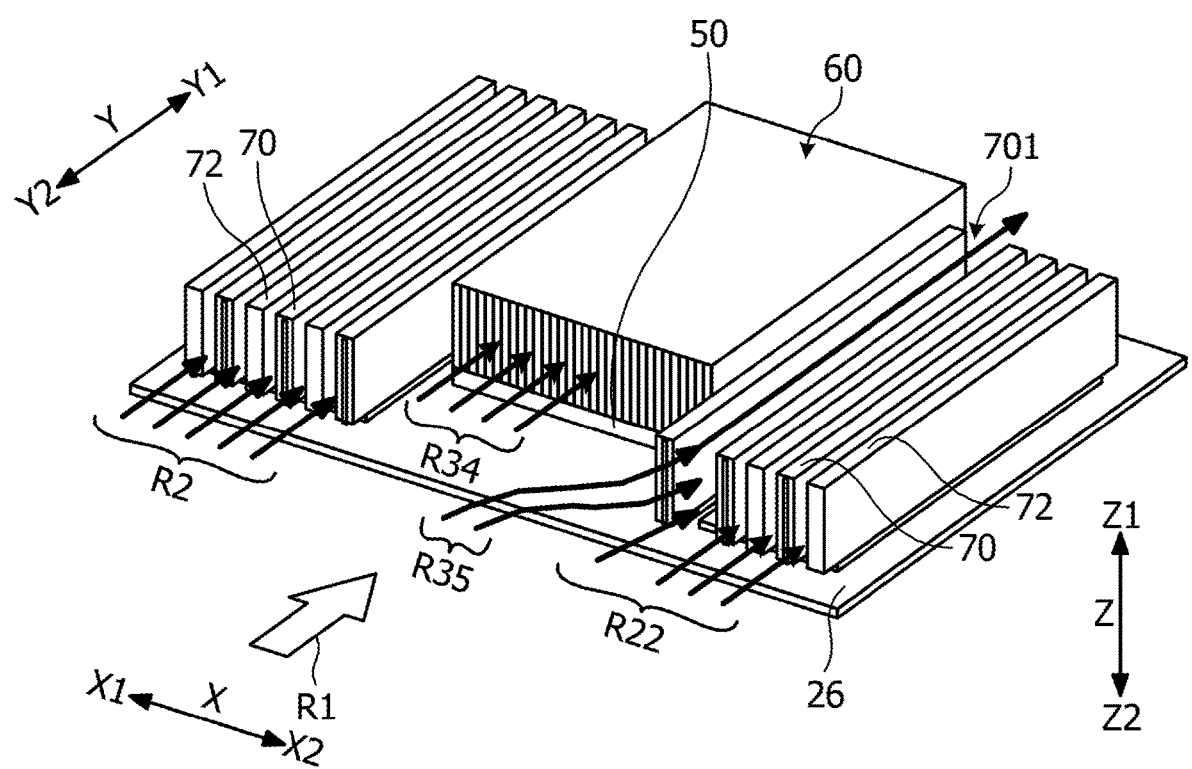
FIG. 12 is an explanatory view of the electronic device according to the second comparative example.
Figure 13:
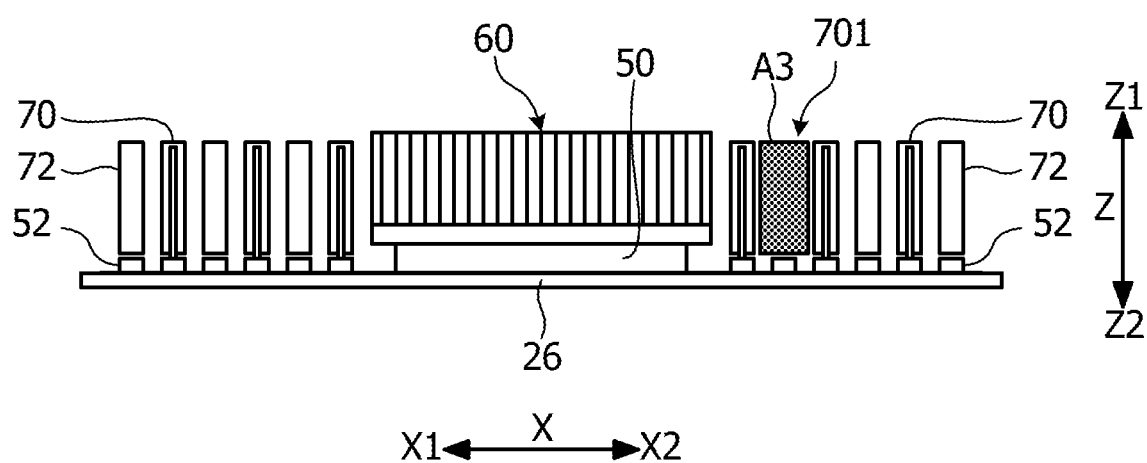
FIG. 13 is an explanatory view of the electronic device according to the second comparative example.

FIGS. 12 and 13 are explanatory views of the electronic device according to a second comparative example, FIG. 12 is a partial perspective view, and FIG. 13 is a front view. In FIGS. 12 and 13, in contrast to FIGS. 10 and 11, the additional electronic components 70 are mounted instead of some of the dummies 72, but a state in which one dummy 72 is not mounted is illustrated. That is, a state in which one dummy 72 has been forgotten is illustrated.

In a case of the electronic device according to the second comparative example, when the dummy 72 is left behind, a state in which the dummies 72 are partially missing is formed. In such a state, as illustrated in FIG. 13, a flow path having a relatively large cross-sectional area is formed at a part (a part where the dummies 72 are missing) 701 on the second region S2 (the cross-sectional area of the flow path is indicated by a hatching region A3). Therefore, as schematically illustrated by the arrow R35 in FIG. 12, the air to be directed to the heat sink 60 flows onto the second region S2 and the flow rate of the air flowing through the heat sink 60 is significantly reduced as compared with the state in which all the dummies 72 are mounted (see FIGS. 10 and 11). That is, in the second comparative example, the supply flow rate of the cooling air to the existing electronic component 50 significantly changes before and after the additional electronic component 70 is added. In a case of the second comparative example, after the addition of the additional electronic component 70, when the dummy 72 is left behind, the supply flow rate of the cooling air to the already mounted electronic component 50 is insufficient, and there is a possibility that the cooling of the already mounted electronic component 50 becomes insufficient.

Further, in a case of the electronic device according to the second comparative example, management and replacement (exchange with the additional electronic component 70) of the dummy 72 are complicated.

On the other hand, according to example 1, it is possible to reduce the inconvenience caused in the first comparative example and the second comparative example as described below.

Figure 14:
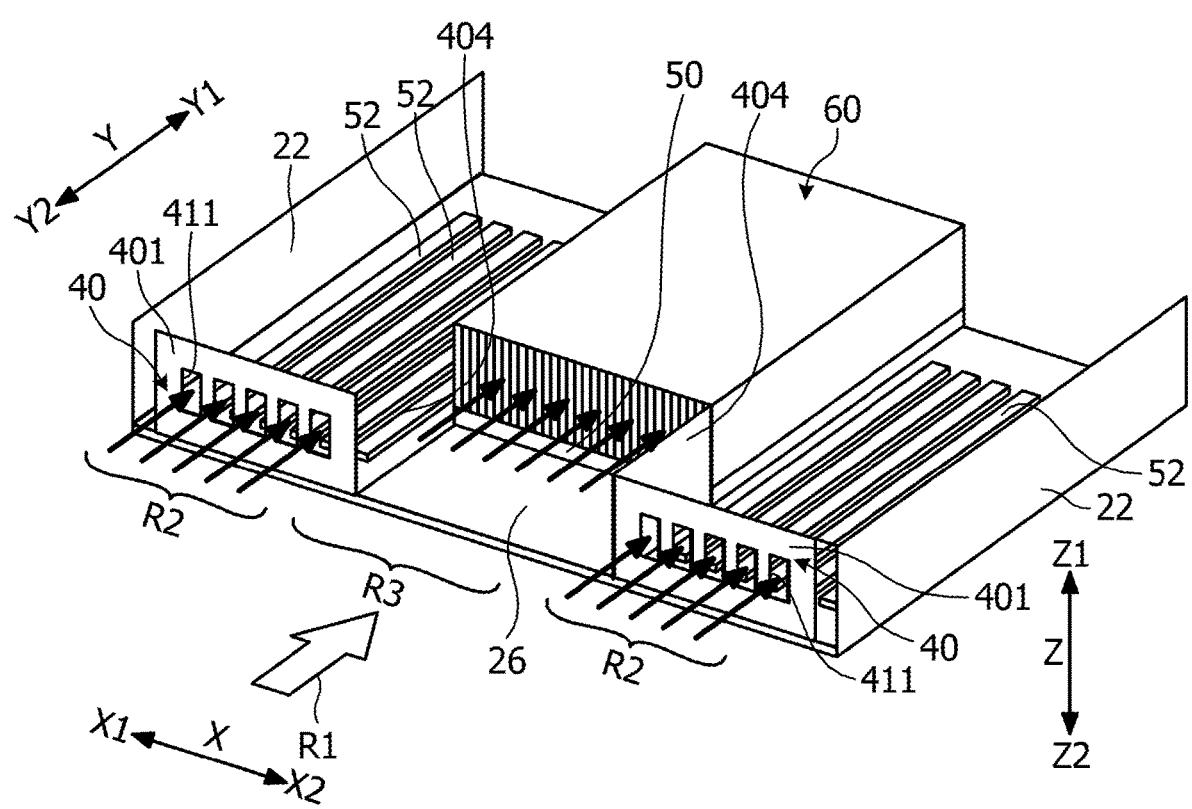
FIG. 14 is an explanatory view of an effect of example 1.
Figure 15:
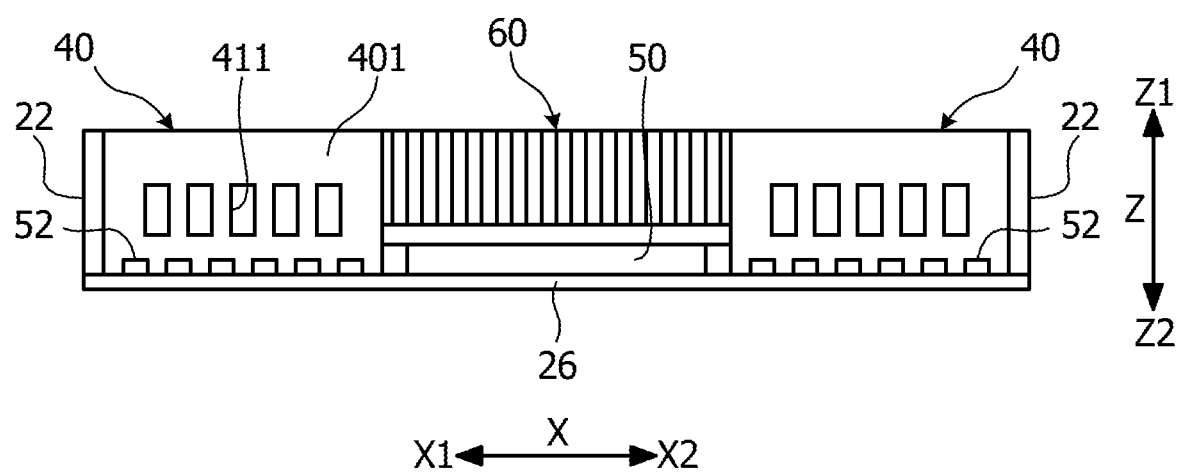
FIG. 15 is an explanatory view of the effect of example 1.
Figure 16:
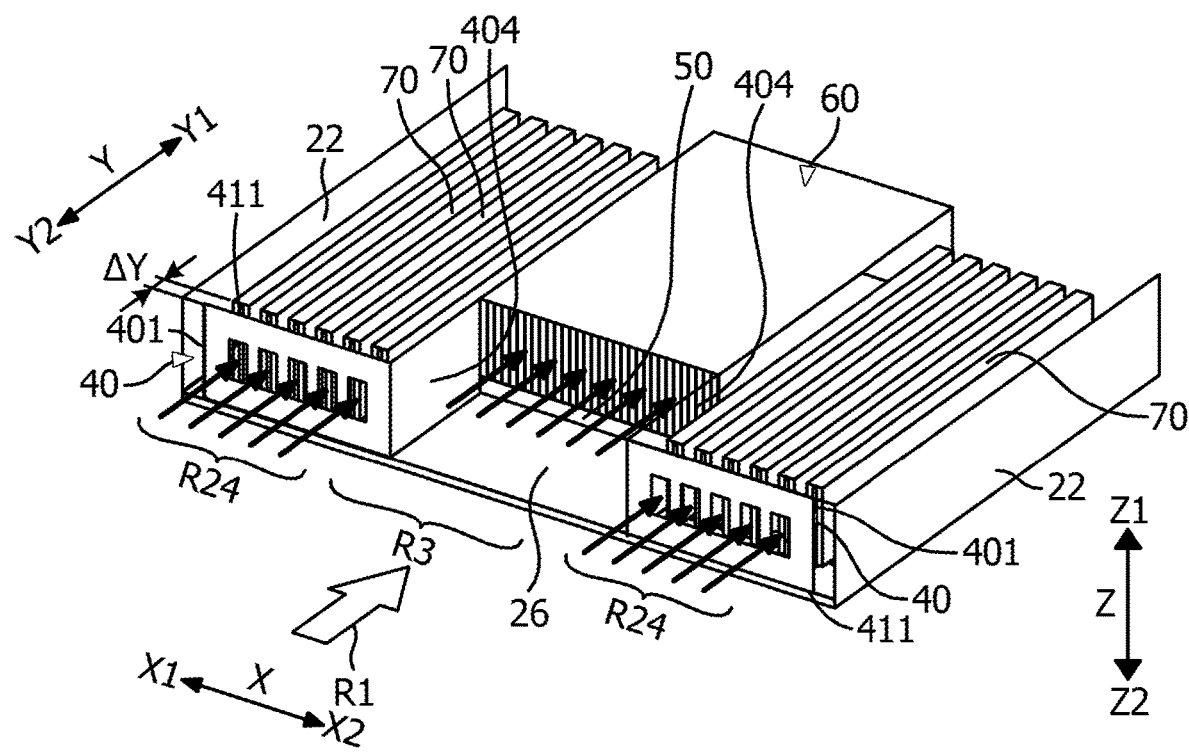
FIG. 16 is an explanatory view of the effect of example 1.
Figure 17:
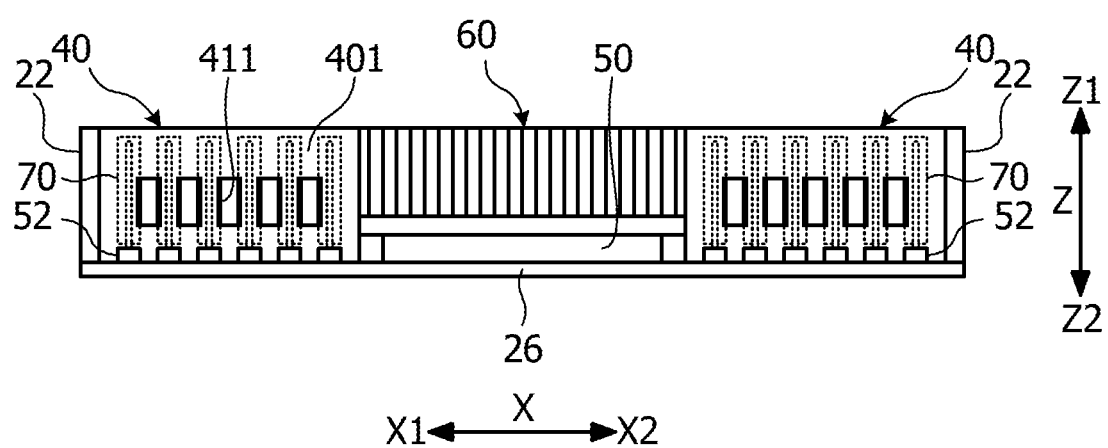
FIG. 17 is an explanatory view of the effect of example 1.

FIGS. 14 to 17 are explanatory views of the effect of example 1, illustrating a part where the front side of the front wall portion 401 of the single unit case 20 is omitted. FIGS. 14 and 16 are perspective views, and FIGS. 15 and 17 are front views. FIGS. 14 and 15 illustrate a state in which no additional electronic component 70 is mounted, and FIGS. 16 and 17 illustrate a state in which all the additional electronic components 70 are mounted on the second region S2. In the structure illustrated in FIGS. 14 to 17, the flow rate adjusting structure 40 on the X1 side does not include the rear wall portion 402, but here, such difference is ignored (the effect of the flow rate adjusting structure 40 including the rear wall portion 402 is described later).

In the state in which all the additional electronic components 70 are not mounted at all, as illustrated in FIG. 14, since the additional electronic component 70 is not mounted, a flow path having a relatively large cross-sectional area is formed on the second region S2 as in the case of the first comparative example. However, in a case of example 1, as illustrated in FIG. 15, since the front wall portion 401 is provided, it is possible to limit the flow rate of the air flowing onto the second region S2 among the flow rates of the air introduced into the unit case 20 in the chassis 10 via the air intake hole 242. In a case of example 1, as illustrated in FIG. 14, since the side wall portion 404 for removing the gap (the gap in the Y direction) between the front wall portion 401 and the electronic component 50 (and the heat sink 60) is provided, it is possible to limit the flow rate of the air flowing onto the second region S2 through such a gap. As a result, as schematically illustrated by the arrow R3 in FIG. 8, the air flowing toward the heat sink 60 is restrained from flowing onto the second region S2, and a desired flow rate of the air flowing through the heat sink 60 may be secured. That is, according to example 1, in a state in which the additional electronic component 70 is not mounted at all, the cooling air may be distributed to the electronic component 50 at an appropriate flow rate.

On the other hand, as illustrated in FIG. 16, in a state where all the additional electronic components 70 are mounted, since the additional electronic component 70 is mounted, a flow path having a relatively small cross-sectional area is formed on the second region S2. However, in a case of example 1, the front wall portion 401 and the side wall portion 404 are provided. Therefore, in this case, the flow rate of the air flowing onto the second region S2 among the flow rates of the air introduced into the unit case 20 in the chassis 10 via the air intake hole 242 is roughly determined according to the opening area of the front wall portion 401, with or without the additional electronic component 70. The opening area of the front wall portion 401 corresponds to the opening area of the through-hole 411, and in a case where a plurality of through-holes 411 exist, the opening area of the front wall portion 401 indicates the sum of the opening areas thereof. Therefore, even in a state in which all the additional electronic components 70 are mounted, the flow rate of the air flowing onto the second region S2 does not substantially change, as illustrated in FIG. 16, as in the state in which not all the additional electronic components 70 are mounted. As a result, even in a state in which all the additional electronic components 70 are mounted, the desired flow rate of the air flowing through the heat sink 60 may be secured as schematically illustrated by the arrow R3 in FIG. 8, as in the state in which not all the additional electronic components 70 are mounted.

In this way, according to example 1, before and after the additional electronic component 70 is added, the change in the supply flow rate of the cooling air to the already mounted electronic component 50 (the change due to addition of the additional electronic component 70) may be reduced as compared with the first comparative example. That is, according to example 1, by providing the front wall portion 401 and the side wall portion 404, it is possible to reduce the influence of the additional electronic component 70 on the flow rate of the air flowing onto the second region S2 through the through-hole 411 of the front wall portion 401. This is because the flow rate of the air flowing onto the second region S2 through the through-hole 411 of the front wall portion 401 is roughly determined according to the opening area of the front wall portion 401, either before or after addition of the additional electronic component 70.

Also, according to example 1, the flow rate of the air flowing onto the second region S2 through the through-hole 411 of the front wall portion 401 is substantially not affected by addition of the additional electronic component 70. Therefore, the opening area of the front wall portion 401 may be set according to the flow rate used for cooling the additional electronic component 70. That is, by appropriately setting the opening area of the front wall portion 401, as illustrated by the arrow R24 in FIG. 16, in a state in which all the additional electronic components 70 are mounted, the cooling air may be supplied to the additional electronic component 70 at a desired flow rate through the through-hole 411 of the front wall portion 401. In this way, according to example 1, in the state in which all the additional electronic components 70 are mounted, it is possible to distribute cooling air at an appropriate flow rate to the electronic component 50 and the additional electronic component 70.

In example 1, as described above, the flow rate of the air flowing onto the second region S2 through the through-hole 411 of the front wall portion 401 is substantially determined according to the opening area of the front wall portion 401 either before or after additional electronic component 70 is added. As described above, this means that the change in the supply flow rate of the cooling air to the already mounted electronic component 50 is reduced by the flow rate adjusting structure 40, before and after the additional electronic component 70 is added. Hereinafter, the function of such flow rate adjusting structure 40 is referred to as a "function of reducing change in the cooling performance before and after addition of additional electronic component 70". Increasing the function of reducing the change in the cooling performance before and after addition of the additional electronic component 70 means to reduce the change in the supply flow rate of the cooling air to the already mounted electronic component 50 before and after addition of additional electronic component 70. Then, the state in which the function of reducing the change in the cooling performance before and after addition of the additional electronic component 70 is maximized corresponds to a state in which there is no change in the supply flow rate of the cooling air to the already mounted electronic component 50 before and after addition of additional electronic component 70.

Here, the influence of the rear wall portion 402 and the backboard 18 on the function of reducing the change in the cooling performance before and after addition of the additional electronic component 70 is described with reference to FIGS. 18 and 19.

Figure 18:
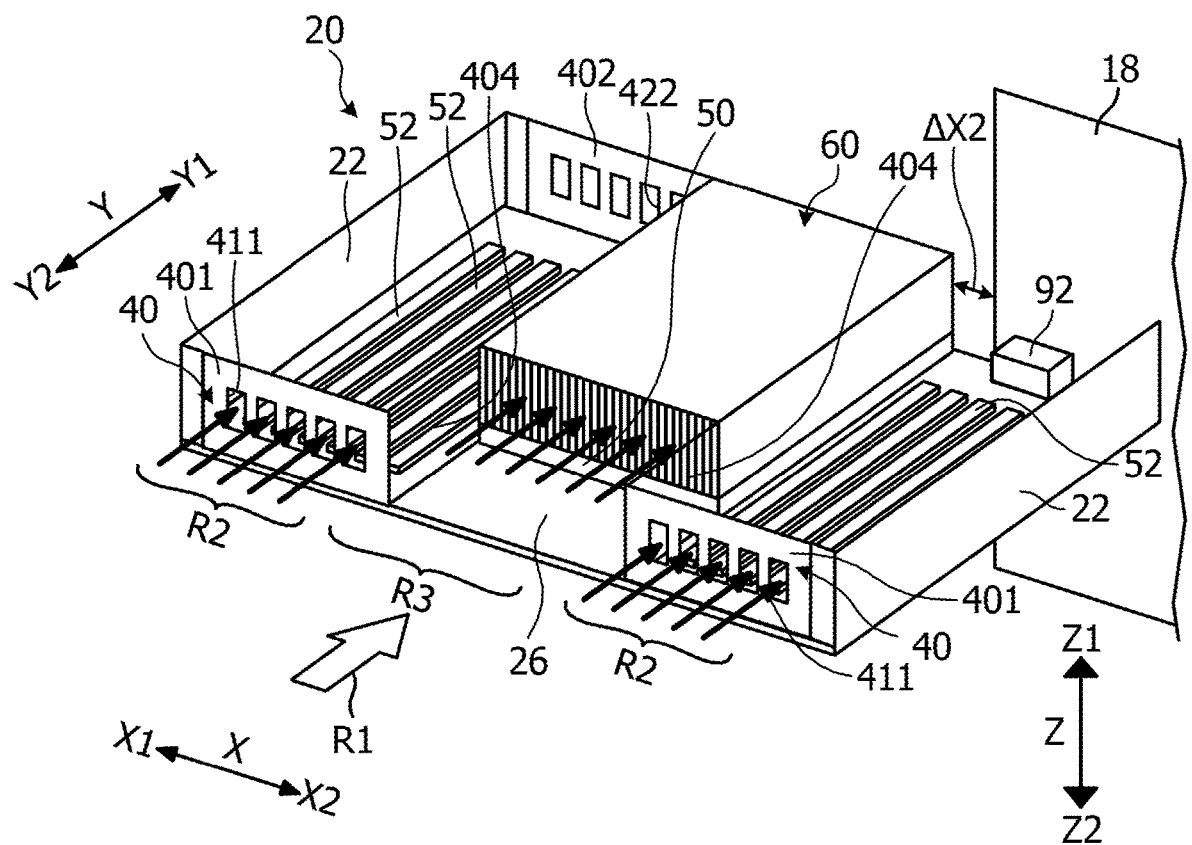
FIG. 18 is an explanatory view of a flow of cooling air in the single unit case of the electronic device according to example 1.
Figure 19:
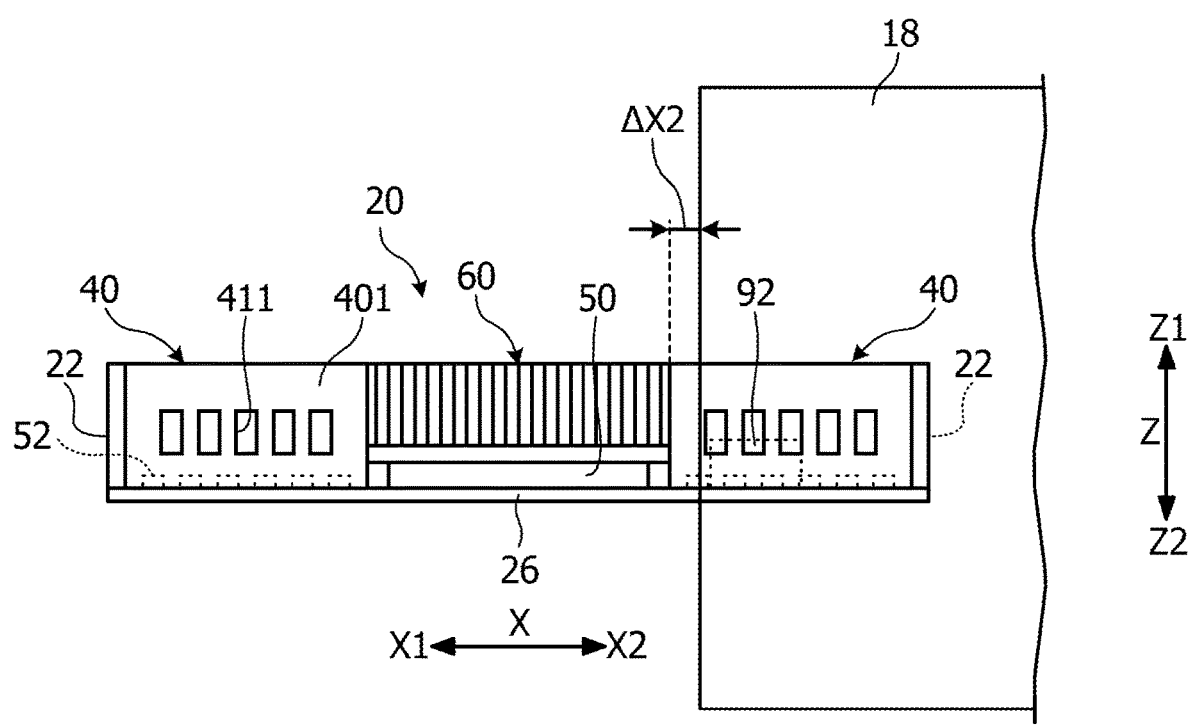
FIG. 19 is an explanatory view of the flow of cooling air in the single unit case of the electronic device according to example 1.

FIGS. 18 and 19 are explanatory views of the flow of cooling air in the single unit case 20 of the electronic device 1 according to example 1 and illustrate a portion where the front side of the front wall portion 401 of the single unit case 20 (for example, the single unit case 20 in the detached state in FIG. 3) is omitted. FIG. 18 is a perspective view, and FIG. 19 is a front view. In FIGS. 18 and 19, the rear wall portion 402 and the backboard 18 are additionally illustrated with respect to FIGS. 14 to 17.

Meanwhile, in a case where the rear wall portion 402 does not have the through-hole 422 and completely blocks the rear side of the second region S2, air does not flow in the Y direction on the second region S2. This means that the function of reducing the change in cooling performance before and after addition of the additional electronic component 70 may not be obtained.

In this regard, in example 1, since the rear wall portion 402 includes the through-hole 422 as described above, the function of reducing the change in the cooling performance before and after the addition is substantially not impaired. In addition, the backboard 18 is provided behind the second region S2 in such a manner that the backboard 18 does not extend in the X direction in the entirety thereof, but a gap ΔX2 is formed in a part thereof. Therefore, due to the backboard 18, the function of reducing the change in the cooling performance before and after the addition is substantially not impaired.

Other Examples

Next, the flow rate adjusting structure according to another example is described with reference to FIGS. 20 to 38. Here, the flow rate adjusting structure in the single unit case 20 is described. Regarding the other example, the same reference numerals are given to the configurations that may be similar to example 1 described above, and the explanation is omitted.

Figure 20:
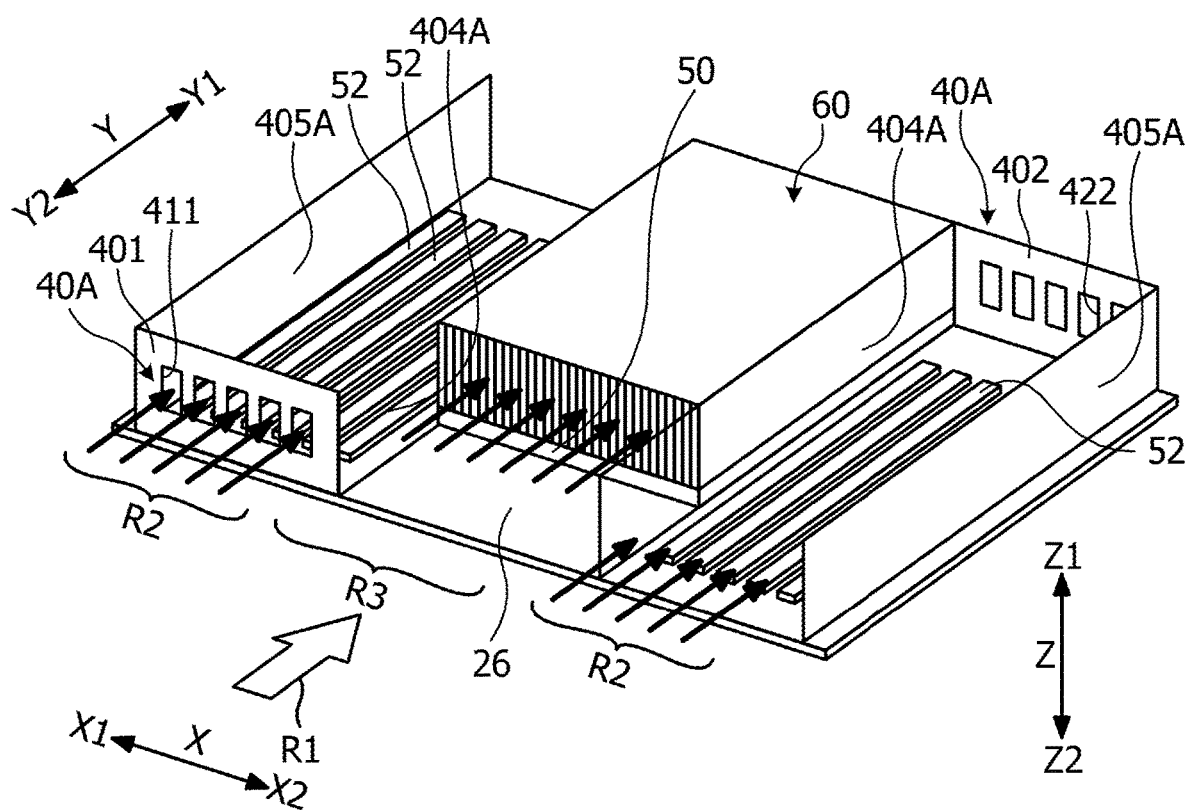
FIG. 20 is an explanatory view of a configuration and an effect of a flow rate adjusting structure according to example 2.
Figure 21:
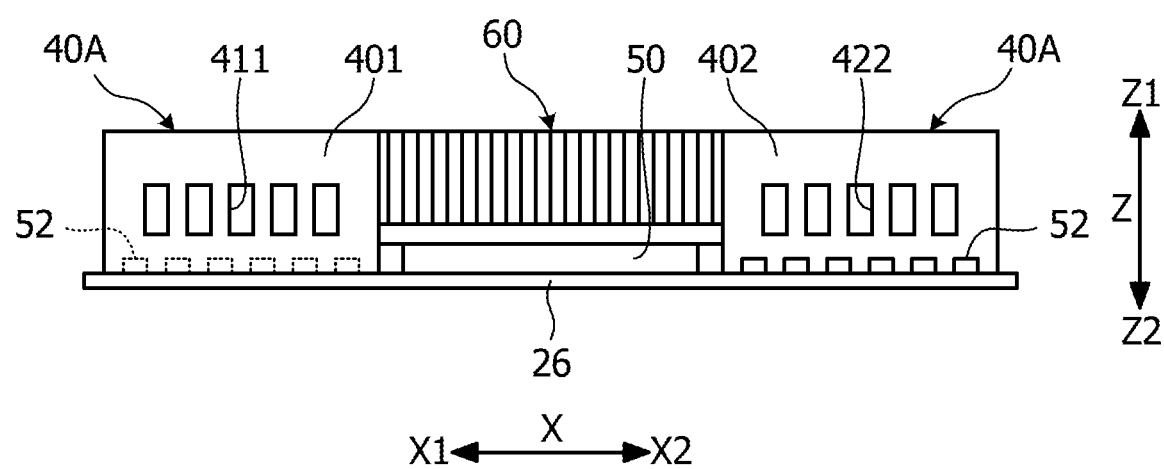
FIG. 21 is an explanatory view of the configuration and the effect of the flow rate adjusting structure according to example 2.
Figure 22:
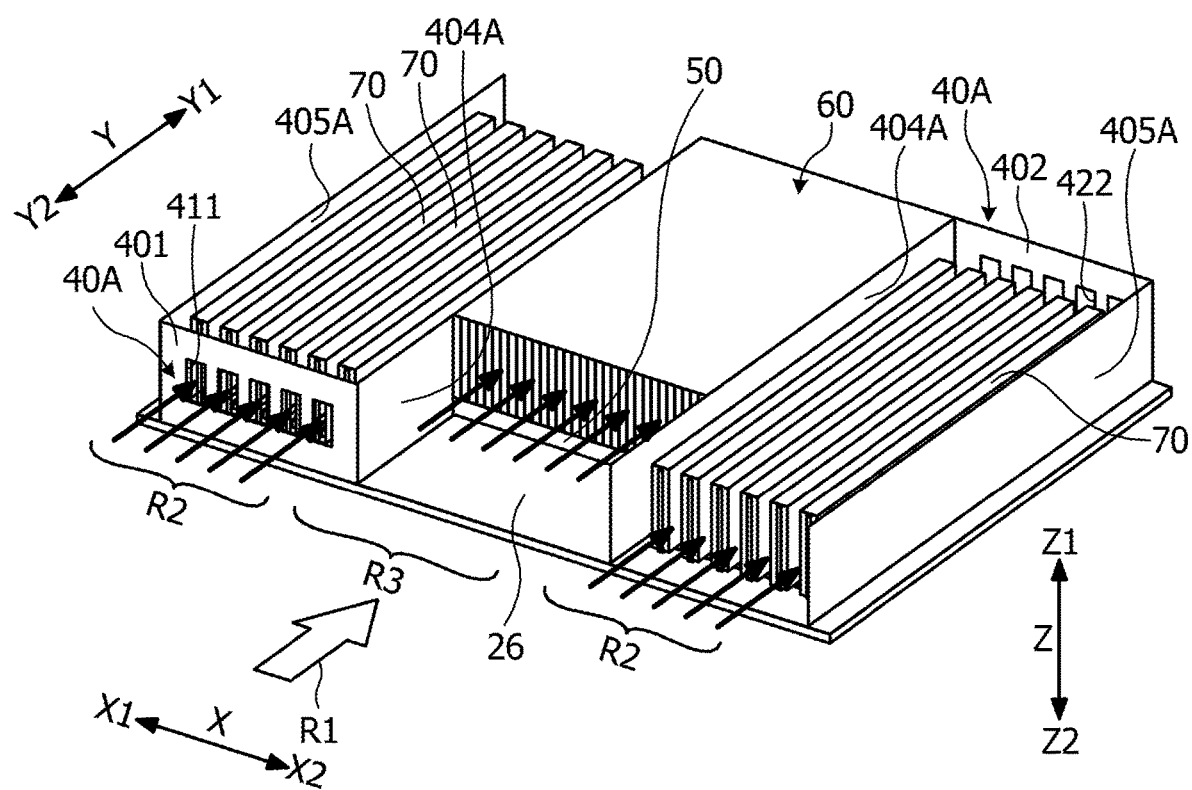
FIG. 22 is an explanatory view of the configuration and the effect of the flow rate adjusting structure according to example 2.
Figure 23:
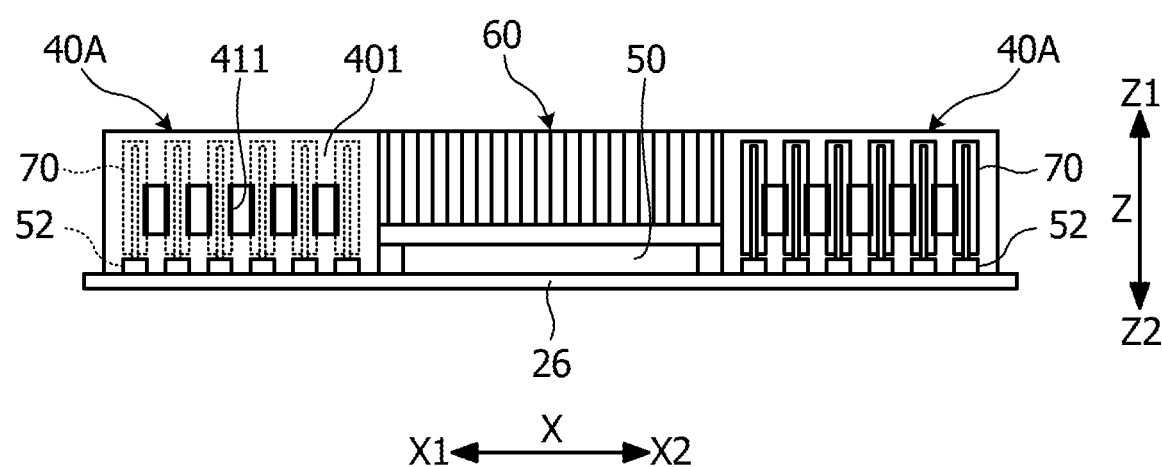
FIG. 23 is an explanatory view of the configuration and the effect of the flow rate adjusting structure according to example 2.

FIGS. 20 to 23 are explanatory views of the configuration and effect of a flow rate adjusting structure 40A according to example 2, in which the front side of the front wall portion 401 of the single unit case 20 is omitted. FIGS. 20 and 22 are partial perspective views, and FIGS. 21 and 23 are front views. FIGS. 20 and 21 illustrate a state in which no additional electronic component 70 is mounted, and FIGS. 22 and 23 illustrate a state in which all the additional electronic components 70 are mounted on the second region S2.

The flow rate adjusting structure 40A according to example 2 is different from the flow rate adjusting structure 40 according to example 1 described above in that only one of the front wall portion 401 and the rear wall portion 402 is provided. Specifically, the flow rate adjusting structure 40A relating to the second region S2 on the X1 side in the X direction includes only the front wall portion 401 among the front wall portion 401 and the rear wall portion 402. In addition, the flow rate adjusting structure 40A relating to the second region S2 on the X2 side in the X direction includes only the rear wall portion 402 among the front wall portion 401 and the rear wall portion 402.

Here, the flow rate of the air flowing onto the second region S2 may be limited both in the upstream side and the downstream side in the flow direction. Therefore, it is arbitrary which of the front wall portion 401 and the rear wall portion 402 is provided.

In this manner, the same effect as that of example 1 described above may be obtained also by example 2.

In example 2, as illustrated in FIGS. 20 to 23, unlike example 1 described above, a side wall portion 404A of the flow rate adjusting structure 40A (the side wall portion 404A provided on the electronic component 50 side in the X direction of the second region S2) is provided over the entire length of the second region S2 in the front and rear. Such the side wall portion 404A is advantageous in that the flow rate of the air flowing to the electronic component 50 side and the outside of the second region S2 may be reduced. The side wall portion 404A is suitable in a case where the end portion on the side of the electronic component 50 in the horizontal direction of the second region S2 is significantly outward (a side far from the electronic component 50 in the X direction) than the electronic component 50.

In example 2, as illustrated in FIGS. 20 to 23, a side wall portion 405A (an example of the second wall portion) of the flow rate adjusting structure 40A is provided. The side wall portion 405A is provided on the side opposite to the electronic component 50 side in the X direction of the second region S2. In this case, the side member 22 of the unit case 20 does not form the flow rate adjusting structure 40A, and the flow rate adjusting structure 40A is realized only by the configuration provided in the substrate 26. The side wall portion 405A is suitable in a case where the end portion of the second region S2 on the side opposite to the electronic component 50 side in the X direction is significantly inward (a side closer to the electronic component 50 in the X direction) than the end portion in the X direction of the substrate 26. In such a case, in the second region S2, it is possible to limit the flow rate of air flowing in the Y direction through the outside of the outermost additional electronic component 70 in the X direction (air not substantially contributing to the cooling of the additional electronic component 70).

Figure 24:
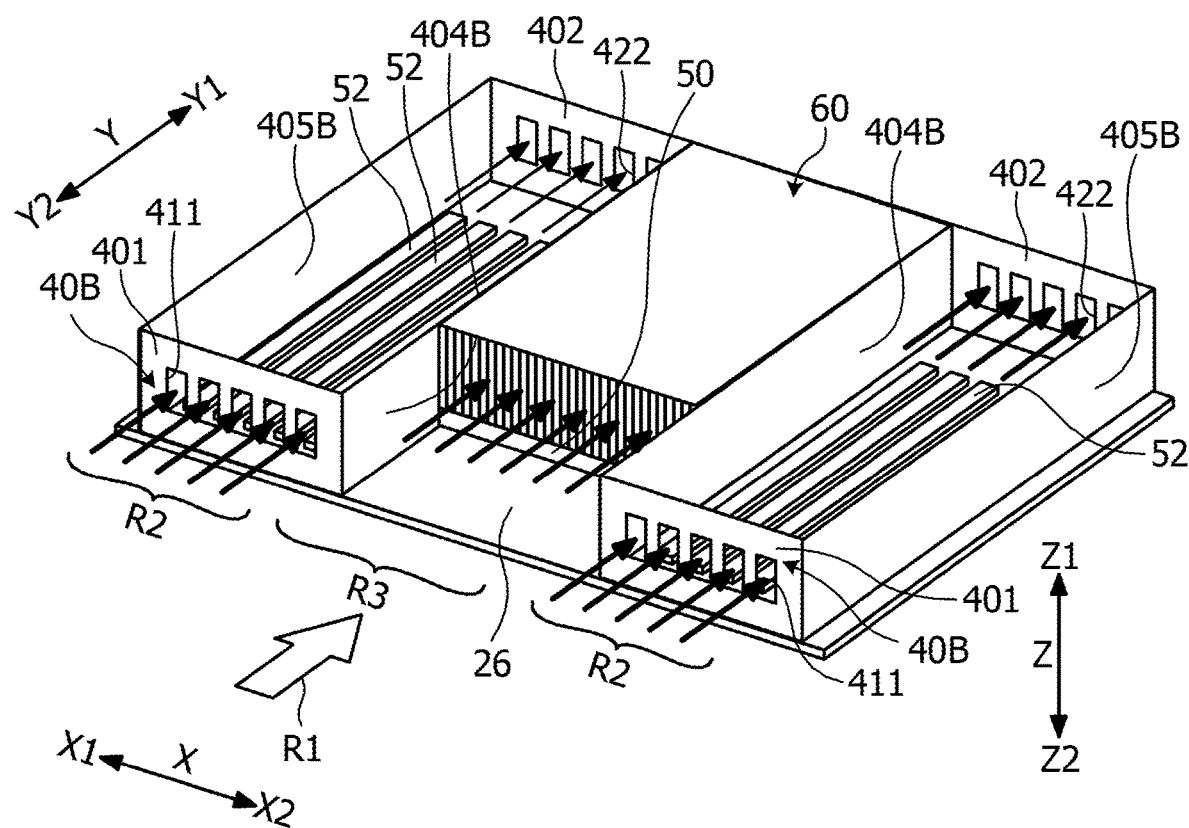
FIG. 24 is an explanatory view of a configuration and an effect of a flow rate adjusting structure according to example 3.
Figure 25:
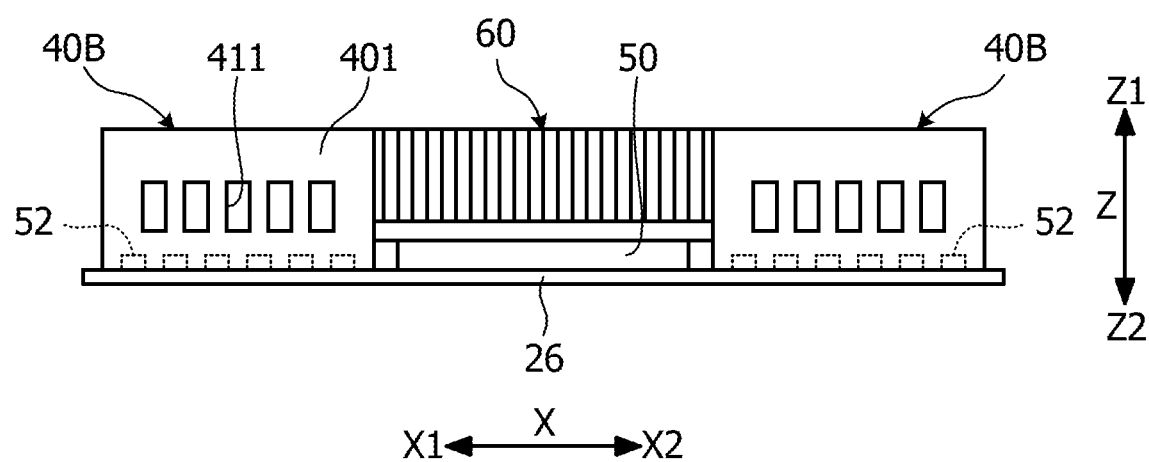
FIG. 25 is an explanatory view of the configuration and the effect of the flow rate adjusting structure according to example 3.
Figure 26:
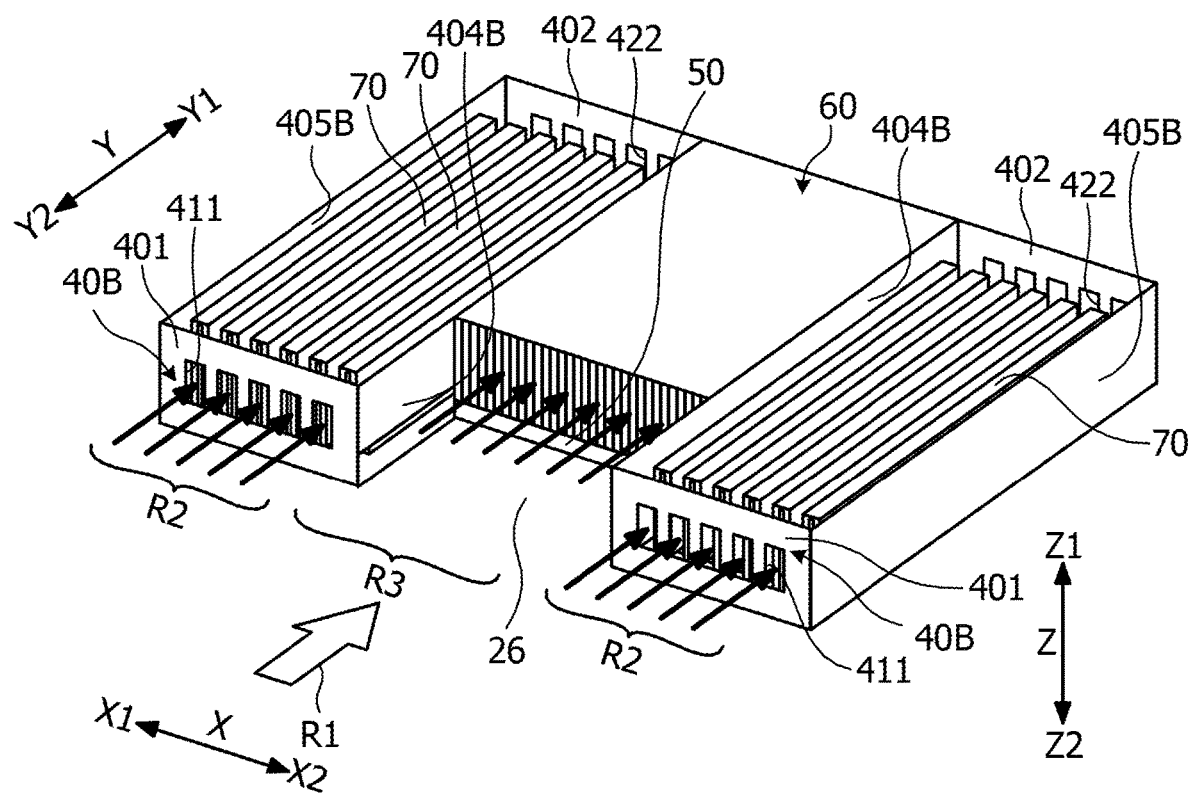
FIG. 26 is an explanatory view of the configuration and the effect of the flow rate adjusting structure according to example 3.
Figure 27:
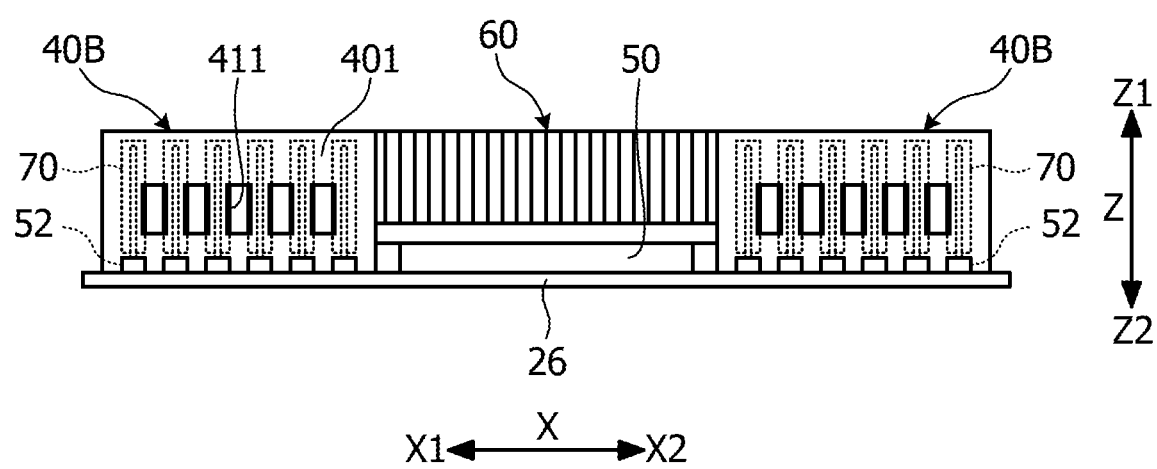
FIG. 27 is an explanatory view of the configuration and the effect of the flow rate adjusting structure according to example 3.
Figure 28:
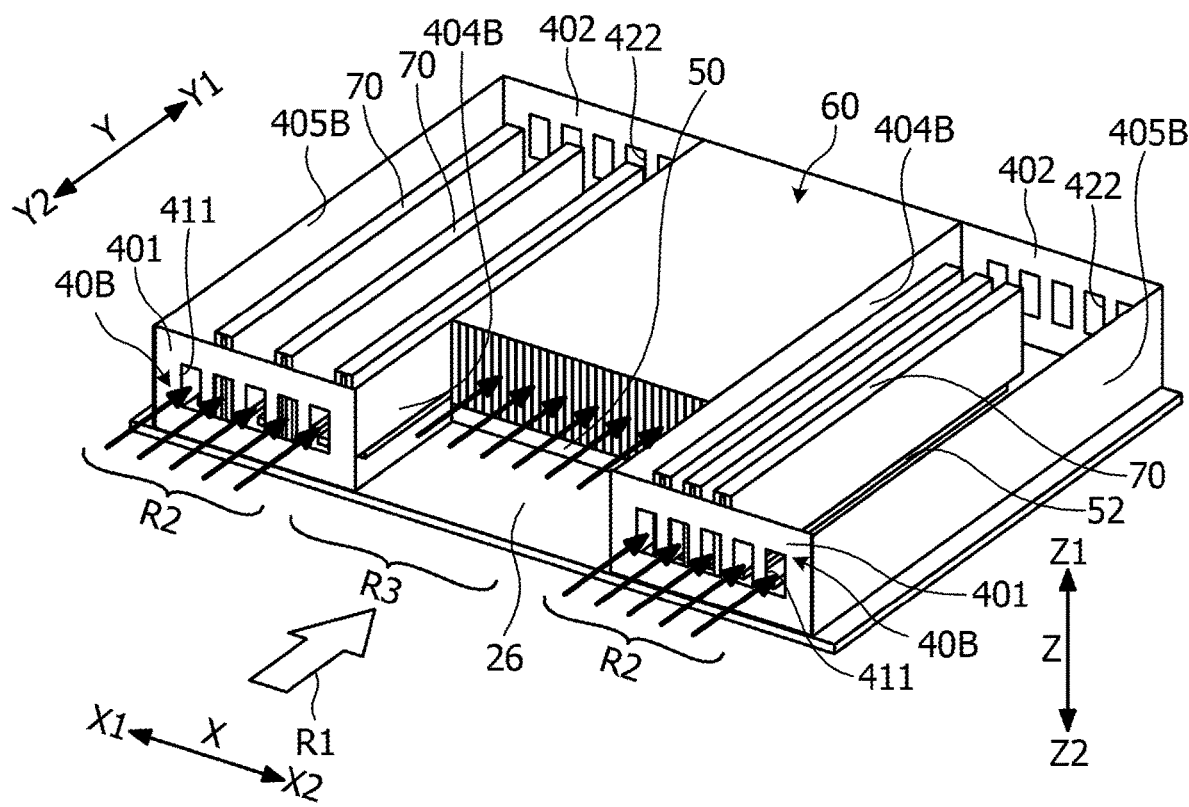
FIG. 28 is an explanatory view of the configuration and the effect of the flow rate adjusting structure according to example 3.
Figure 29:
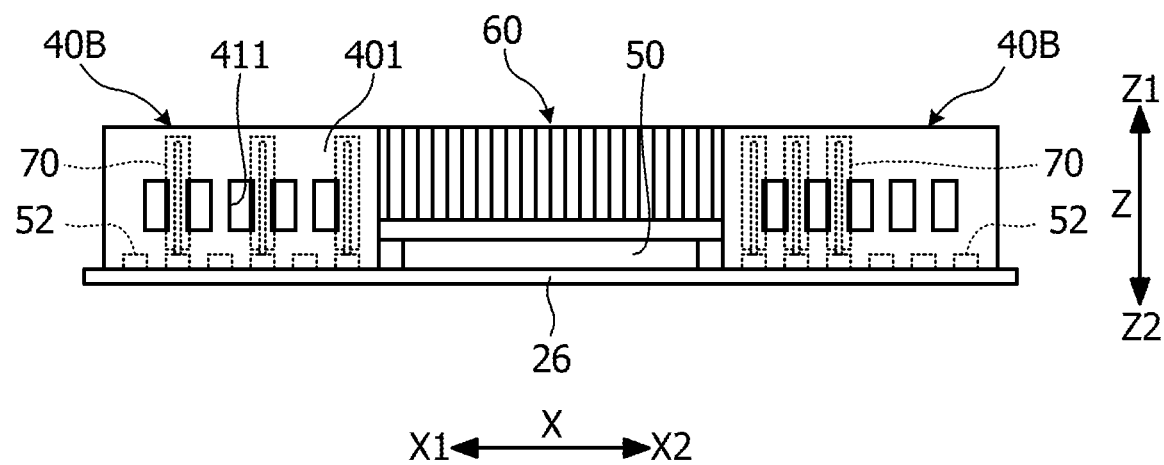
FIG. 29 is an explanatory view of the configuration and the effect of a flow rate adjusting structure according to example 3.

FIGS. 24 to 29 are explanatory views of the configuration and effect of a flow rate adjusting structure 40B according to example 3, in which the front side of the front wall portion 401 of the single unit case 20 is omitted. FIGS. 24, 26, and 28 are partial perspective views, and FIGS. 25, 27, and 29 are front views. FIGS. 24 and 25 illustrate a state in which no additional electronic component 70 is mounted, and FIGS. 26 and 27 illustrate a state in which all the additional electronic components 70 are mounted on the second region S2. In addition, FIGS. 28 and 29 illustrate a state in which the additional electronic components 70 are partially mounted (only three on one side) in the second region S2.

The flow rate adjusting structure 40B according to example 3 is different from the flow rate adjusting structure 40 according to example 1 described above in that the front wall portion 401 and the rear wall portion 402 are provided for any of the second regions S2 on the X1 side and the X2 side in the X direction. Therefore, even with example 3, the same effect as example 1 described above may be obtained.

Further, in example 3, the through-hole 411 of the front wall portion 401 is formed in the same manner as the through-hole 422 of the rear wall portion 402. Specifically, as illustrated in FIG. 24, the through-hole 411 of the front wall portion 401 and the through-hole 422 of the rear wall portion 402 are formed with the same size and the same number and overlap when viewed in the Y direction. As a result, the air having passed through the through-hole 422 of the rear wall portion 402 toward the Y1 side in the Y direction passes through the through-hole 422 of the rear wall portion 402 with the same flow distribution. This means that the flow velocity is maintained on the upstream side and the downstream side of the additional electronic component 70. As a result, the influence of the difference in an addition pattern of the additional electronic component 70 may also be reduced with respect to the flow rate of the air flowing in the Y direction on the lateral side (both sides in the X direction) of the additional electronic component 70. In addition, for example, as illustrated in FIGS. 28 and 29, even in a state in which the additional electronic components 70 are partially mounted on the second region S2, the cooling air may be distributed to the electronic component 50 and each additional electronic component 70 at an appropriate flow rate.

In example 3, as illustrated in FIGS. 24 to 29, unlike example 1 described above, a side wall portion 404B of the flow rate adjusting structure 40B (the side wall portion 404B provided on the electronic component 50 side in the X direction of the second region S2) is provided over the entire length of the second region S2 in the front and rear. The side wall portion 404B is advantageous in that the flow rate of the air flowing to the electronic component 50 side and the outside of the second region S2 may be reduced.

In addition, in example 3, as illustrated in FIGS. 24 to 29, the side wall portion 405B of the flow rate adjusting structure 40B (the side wall portion 405B provided on the side opposite to the electronic component 50 side in the X direction in the second region S2) is provided. The side wall portion 405B is suitable in a case where the end portion of the second region S2 on the outer side in the horizontal direction is significantly inward (the side closer to the electronic component 50 in the X direction) than the end portion in the horizontal direction of the substrate 26.

Next, a preferable example regarding the arrangement of the through-holes 411 is described with reference to FIGS. 25, 27, and 29. In FIGS. 25, 27, and 29, which are front views viewed in the Y direction, a portion behind the front wall portion 401 in the Y direction is indicated by a dotted line.

Meanwhile, in the state in which the additional electronic component 70 is mounted, in a case where the additional electronic component 70 overlaps the through-hole 411 when viewed in the Y direction, the additional electronic component 70 becomes a resistance. Therefore, in a case where the additional electronic component 70 overlaps the through-hole 411, the flow rate of the air flowing onto the second region S2 through the through-hole 411 is slightly reduced as compared with the case where the additional electronic component 70 does not overlap. In a case where the additional electronic component 70 is in a positional relationship of overlapping the through-hole 411 when viewed in the Y direction, this means that the function of reducing the change in the cooling performance before and after addition of the additional electronic component 70 is slightly reduced. Therefore, in order to enhance the function of reducing the change in the cooling performance before and after addition of the additional electronic component 70, it is desirable to form the through-hole 411 at a position where the additional electronic component 70 does not overlap when viewed in the Y direction.

Therefore, in example 3, as illustrated in FIGS. 25, 27, and 29, in the state in which the additional electronic component 70 is mounted, the through-hole 411 of the front wall portion 401 is preferably formed at a position where the through-hole 411 does not substantially overlap the additional electronic component 70 when viewed in the Y direction. Specifically, the through-hole 411 is preferably provided so that the center of the opening (the center in the X direction) is located between the two connectors 52 adjacent to each other in the X direction (midpoint). This further enhances the function of reducing the change in the cooling performance before and after addition of the additional electronic component 70. In addition, as illustrated in FIGS. 25, 27, and 29, the through-hole 411 is preferably formed in a rectangular shape elongated in the Z direction. As a result, even in a case where the spacing in the X direction of the additional electronic component 70 (and accordingly the spacing between the two adjacent connectors 52 in the X direction) is relatively small, it is easy to form the through-hole 411 so that the through-hole 411 does not overlap the additional electronic component 70 when viewed in the Y direction.

Similarly, in example 3, the through-hole 422 of the rear wall portion 402 is preferably formed at a position where the through-hole 422 does not substantially overlap the additional electronic component 70 when viewed in the Y direction in a state in which the additional electronic component 70 is mounted. This further enhances the function of reducing the change in the cooling performance before and after addition of the additional electronic component 70.

A preferable example relating to such arrangement of the through-hole 411 may also be applied to example 1 and example 2 described above.

Next, a preferable example regarding the opening area of the front wall portion 401 is described with reference to FIGS. 30A to 30C.

Figure 30A:
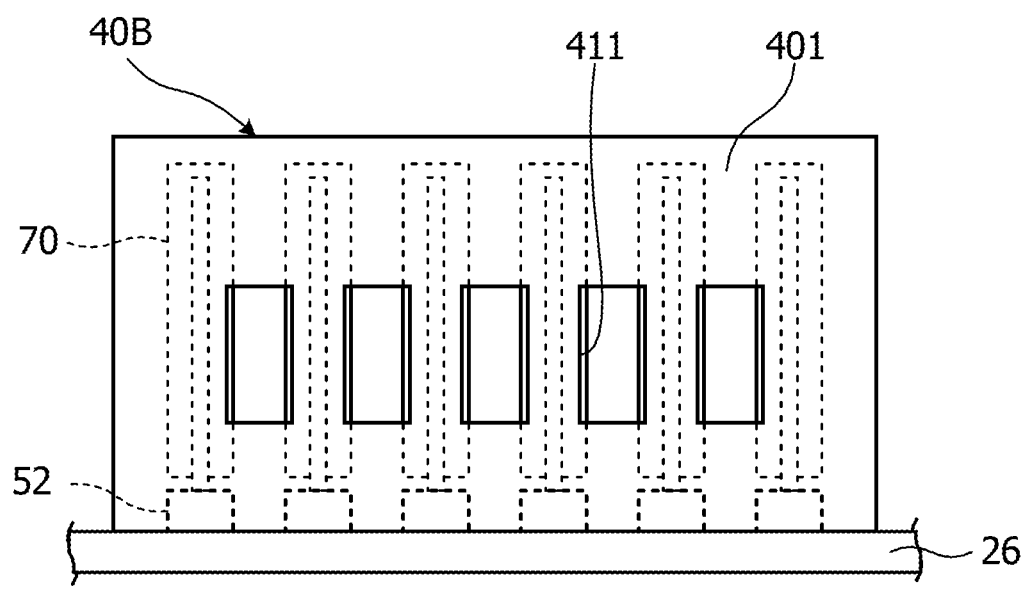
FIG. 30A is an explanatory view of a preferable example relating to an opening area of a through-hole.
Figure 30B:
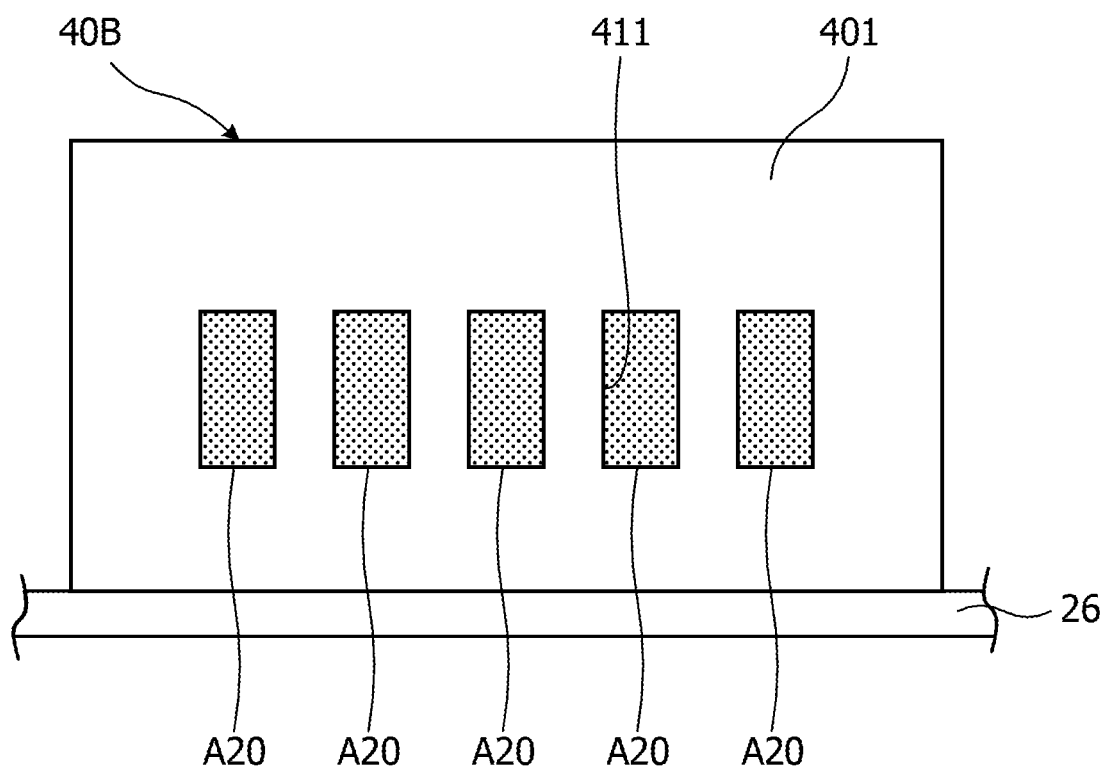
FIG. 30B is an explanatory view of the preferable example relating to the opening area of the through-hole.
Figure 30C:
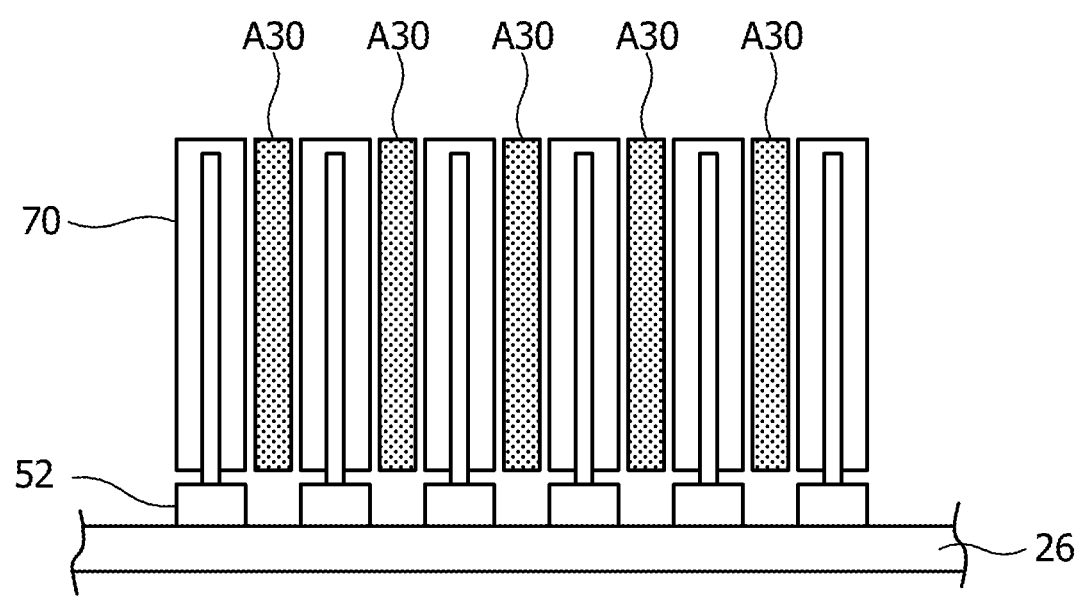
FIG. 30C is an explanatory view of the preferable example relating to the opening area of the through-hole.

FIGS. 30A to 30C are front views illustrating the relationship between the front electronic component 70 and the front wall portion 401 relating to the second region S2. FIG. 30A is a view illustrating the positional relationship between the front wall portion 401 and the additional electronic component 70 relating to one second region S2 in perspective through the additional electronic component 70. FIG. 30B is an explanatory view of the sum of the opening areas of the through-holes 411 in the front wall portion 401 according to one second region S2. FIG. 30C is an explanatory view of the flow path cross-sectional area in the state in which the additional electronic component 70 is mounted.

Meanwhile, in a state in which the additional electronic component 70 is mounted, the cross-sectional area (hereinafter, referred to as a "flow path cross-sectional area in a mounted state of the additional electronic component 70") of the flow path on the second region S2 when viewed in the Y direction is significantly smaller than the cross-sectional area of the flow path in the state in a state in which the additional electronic component 70 is not mounted. The flow path cross-sectional area in the mounted state of the additional electronic component 70 is determined according to the shape of the additional electronic component 70 and the like. For example, based on known shape information of the additional electronic component 70, the flow path cross-sectional area in the mounted state of the additional electronic component 70 may be derived based on the sum of a cross-sectional area A30 (see FIG. 30C) of the space between the additional electronic components 70 when viewed in the Y direction. Hereinafter, the flow path formed by the space between the additional electronic components 70 when viewed in the Y direction (a space having the cross-sectional area A30 when viewed in the Y direction) is also called a "flow path between the additional electronic components".

In a case where the flow path cross-sectional area in the mounted state of the additional electronic component 70 is significantly smaller than the sum of the opening areas A20 (see FIG. 30B) of the respective through-holes 411 in the front wall portion 401, the resistance when air passes through the through-hole 411 increases. Therefore, in a case where the flow path cross-sectional area in the mounted state of the additional electronic component 70 is significantly smaller than the total opening area of the through-holes 411 in the front wall portion 401, the flow rate of the air flowing onto the second region S2 through the through-hole 411 and flowing is slightly reduced as compared with the case where the flow path cross-sectional area in the mounted state of the additional electronic component 70 is not significantly smaller than the total opening area of the through-holes 411 in the front wall portion 401. In a case where the flow path cross-sectional area in a state in which the additional electronic component 70 is mounted is significantly smaller than the sum of the opening areas of the through-holes 411 in the front wall portion 401, this means that the function of reducing the change in the cooling performance before and after addition of the additional electronic component 70 is slightly reduced. Therefore, in order to enhance the function of reducing the change in the cooling performance before and after addition of the additional electronic component 70, it is desirable that the through-hole 411 is formed so that the flow path cross-sectional area in a state in which the additional electronic component 70 is mounted is equal to or larger than the sum of the opening areas of the through-holes 411 in the front wall portion 401.

Therefore, in example 3, each through-hole 411 of the front wall portion 401 is formed so that the sum of the opening areas of the through-holes 411 is equal to or smaller than the flow path cross-sectional area in a state in which the additional electronic component 70 is mounted. Specifically, the opening area of one through-hole 411 is equal to or smaller than the cross-sectional area (see A30 in FIG. 30C) of the one flow path between the additional electronic components corresponding to the one through-hole 411. The one flow path between the additional electronic components corresponding to one through-hole 411 indicates the one flow path between two additional electronic components 70 on both sides in the X direction with respect to the one through-hole 411 in the Y direction. When the opening area of each through-hole 411 is the same and the cross-sectional area A30 of each flow path between the additional electronic components is the same, the opening area of one through-hole 411 is equal to or smaller than the cross-sectional area A30. This further enhances the function of reducing the change in the cooling performance before and after addition of the additional electronic component 70.

A preferable example regarding the opening area of the through-hole 411 as described above may also be applied to example 1 and example 2 described above.

Figure 31:
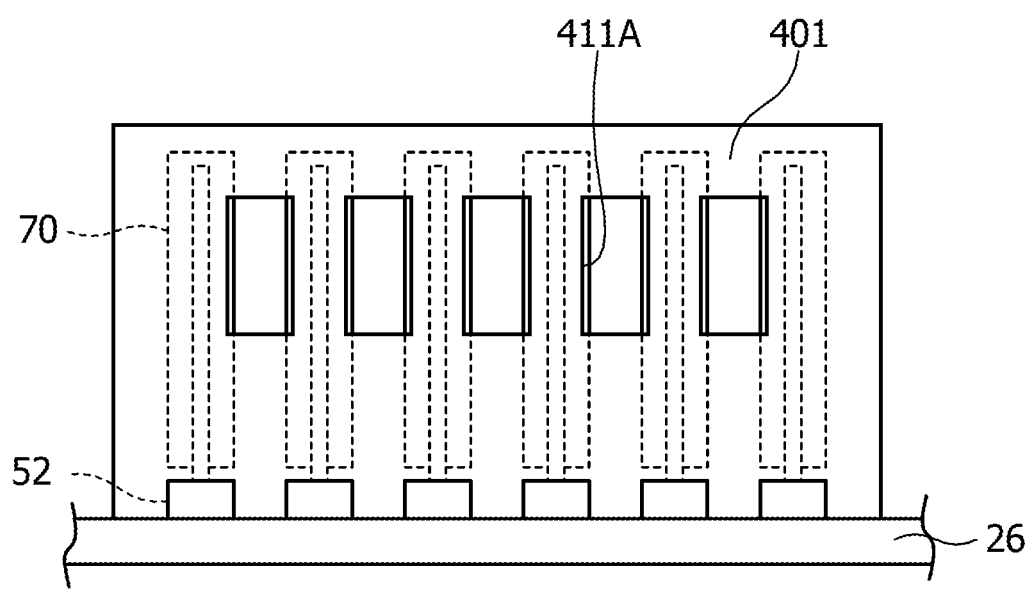
FIG. 31 is an explanatory view of another preferable example regarding an arrangement and the opening area of the through-hole.
Figure 32:
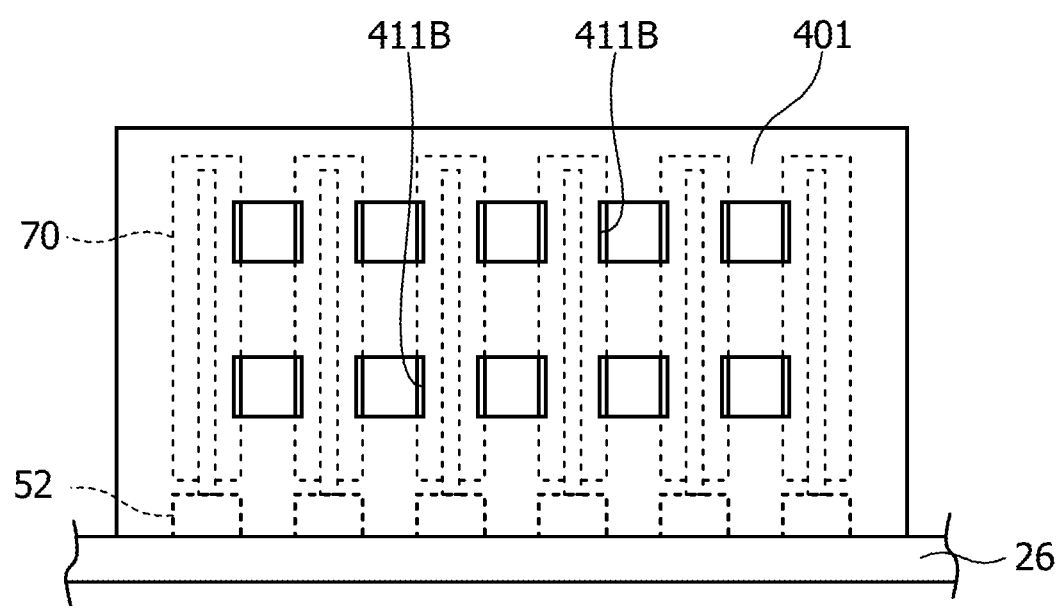
FIG. 32 is an explanatory view of another preferable example regarding the arrangement and the opening area of the through-hole.

FIGS. 31 and 32 are explanatory views of another preferable example regarding the arrangement and the opening area of the through-hole. FIGS. 31 and 32 are front views illustrating the relationship between the front wall portion 401 and additional electronic component 70 relating to one second region S2, illustrating the additional electronic component 70 in perspective.

In the example illustrated in FIG. 31, a point that a through-hole 411A is located above the through-hole 411 illustrated in FIG. 30A is different. Such the through-hole 411A is suitable in a case where a portion with a high heating value in the additional electronic component 70 is located above. Also in the example illustrated in FIG. 31, each through-hole 411A is formed so that the sum of the opening areas of respective through-holes 411A is equal to or smaller than the flow path cross-sectional area in a state in which the additional electronic component 70 is mounted.

In the example illustrated in FIG. 32, a through-hole 411B is divided into upper and lower parts. Such the through-hole 411B is suitable in a case where a portion with a high heat generation amount in the additional electronic component 70 is positioned separately above and below. Also in the example illustrated in FIG. 32, each through-hole 411B is formed so that the sum of the opening areas of respective through-holes 411B is equal to or smaller than the flow path cross-sectional area in a state in which the additional electronic component 70 is mounted.

As illustrated in FIGS. 31 and 32, the arrangement pattern of the through-holes in the front wall portion 401 may be determined according to a high heating position of the additional electronic component 70 and may be various. Example of the arrangement patterns as illustrated in FIGS. 31 and 32 may also be applied to example 1 and example 2 described above.

Figure 33:
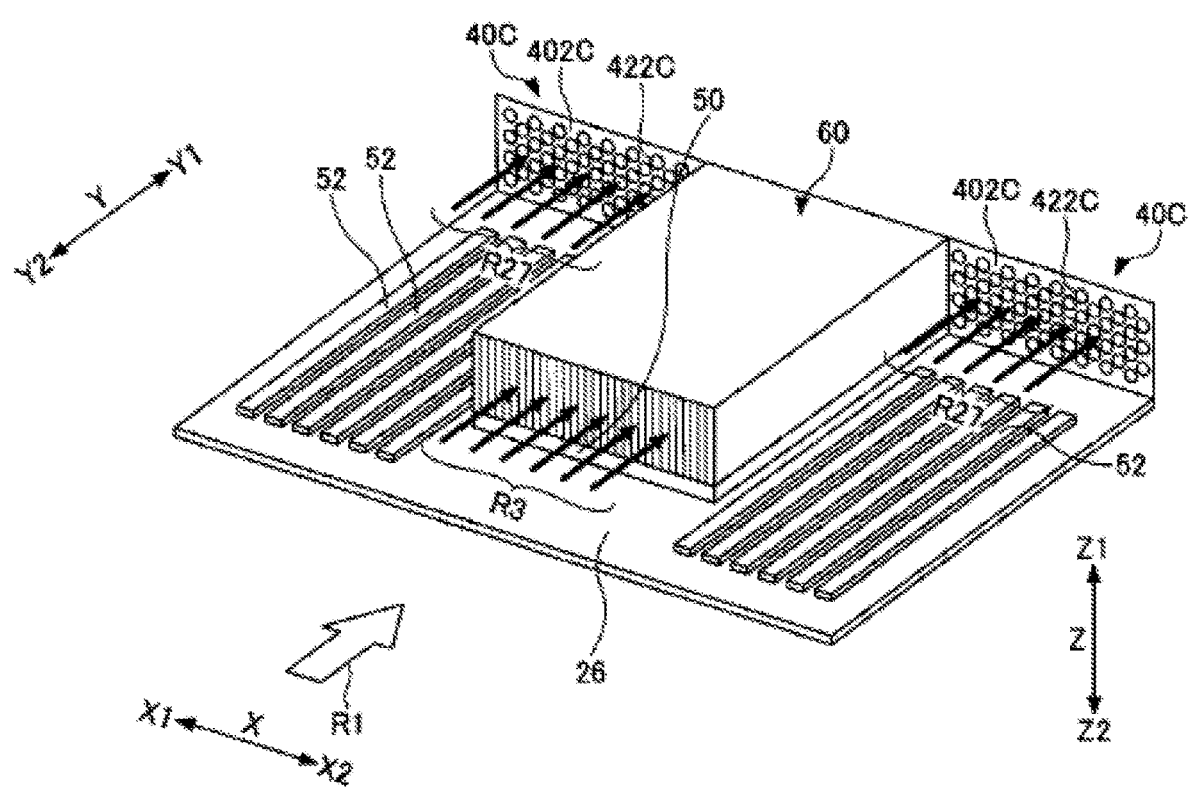
FIG. 33 is an explanatory view of a configuration and an effect of a flow rate adjusting structure according to example 4.
Figure 34:
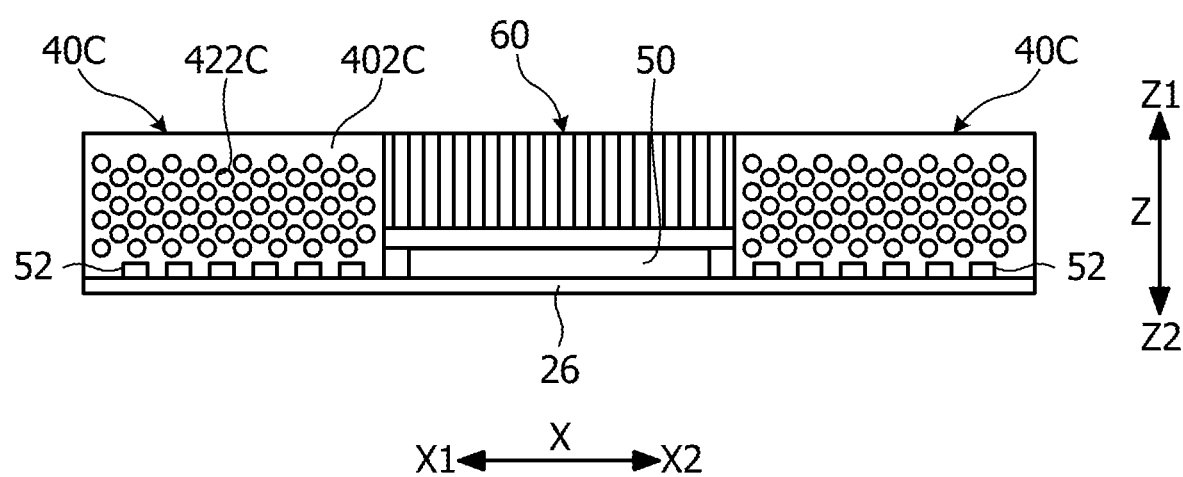
FIG. 34 is an explanatory view of the configuration and the effect of the flow rate adjusting structure according to example 4.

FIGS. 33 and 34 are explanatory views of the configuration and effect of the flow rate adjusting structure 40C according to the example 4 and illustrate a part where the front side is omitted from the front end of the second region S2 of the single unit case 20. FIG. 33 is a partial perspective view, and FIG. 34 is a front view. FIGS. 33 and 34 illustrate a state in which additional electronic component 70 is not mounted at all.

A flow rate adjusting structure 40C according to example 4 is different from the flow rate adjusting structure 40 according to example 1 described above in that the front wall portion 401 and the side wall portion 404 are removed and the rear wall portion 402 is replaced with a rear wall portion 402C. The flow rate adjusting structure 40C includes a side member 22 (not illustrated) similarly to example 1 described above.

The rear wall portion 402C includes a plurality of circular through-holes 422C (an example of the opening) for allowing air to flow on the second region S2. The through-hole 422C may perform the same function as the through-hole 422 according to example 1 described above.

As described above, the flow rate of the air flowing onto the second region S2 may be limited both in the upstream side and the downstream side in the flow direction. Therefore, even with example 4, the same effect as example 1 described above may be obtained. That is, as schematically illustrated by the arrow R27 in FIG. 33, the flow rate of air passing over the second region S2 and passing from the rear wall portion 402C to the Y1 side is substantially determined by the opening area of the through-hole 422C in the rear wall portion 402C. This is the same both before and after addition of additional electronic component 70. Therefore, also in example 4, the function of reducing the change in the cooling performance before and after addition of the additional electronic component 70 is exhibited.

As illustrated in FIG. 34, the through-hole 422C is also provided at a position where the through-hole 422C overlaps the additional electronic component 70 in the Y direction. Therefore, the flow rate of the air flowing onto the second region S2 through the through-hole 422C is slightly reduced as compared with the case where the through-hole is arranged so as not to overlap the additional electronic component 70 when viewed in the Y direction. In order to reduce such inconvenience, the through-hole 422C may be formed only between the connectors 52 in the X direction.

Figure 35:
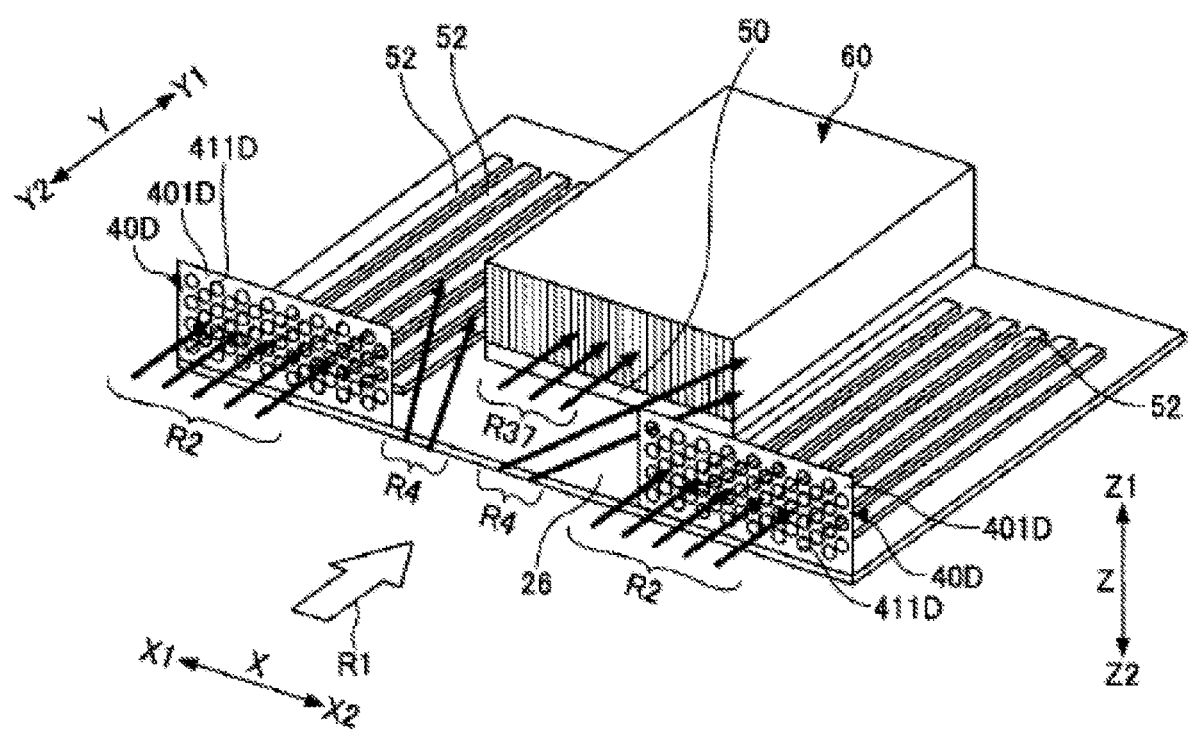
FIG. 35 is an explanatory view of the configuration and the effect of the flow rate adjusting structure according to example 5.
Figure 36:
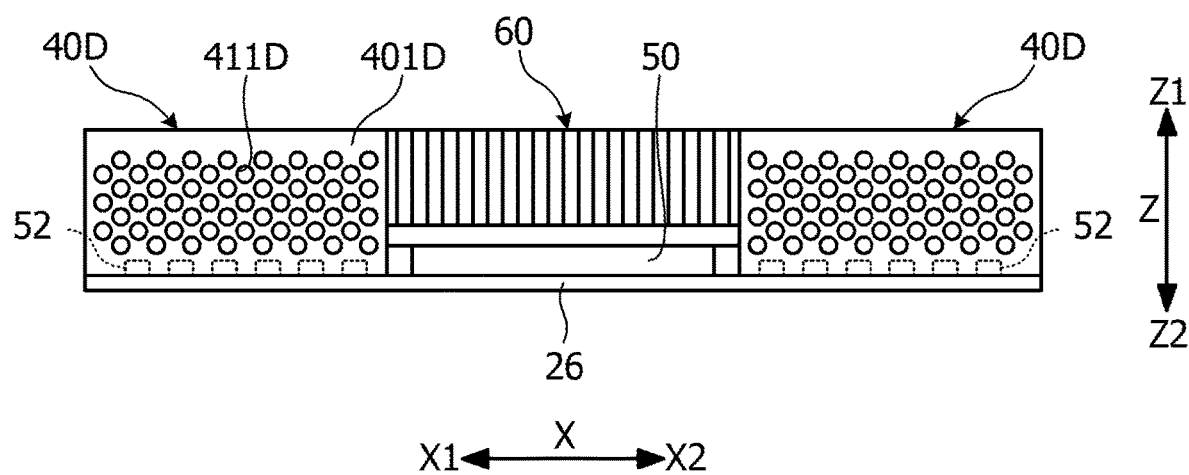
FIG. 36 is an explanatory view of a configuration and an effect of a flow rate adjusting structure according to example 5.
Figure 37:
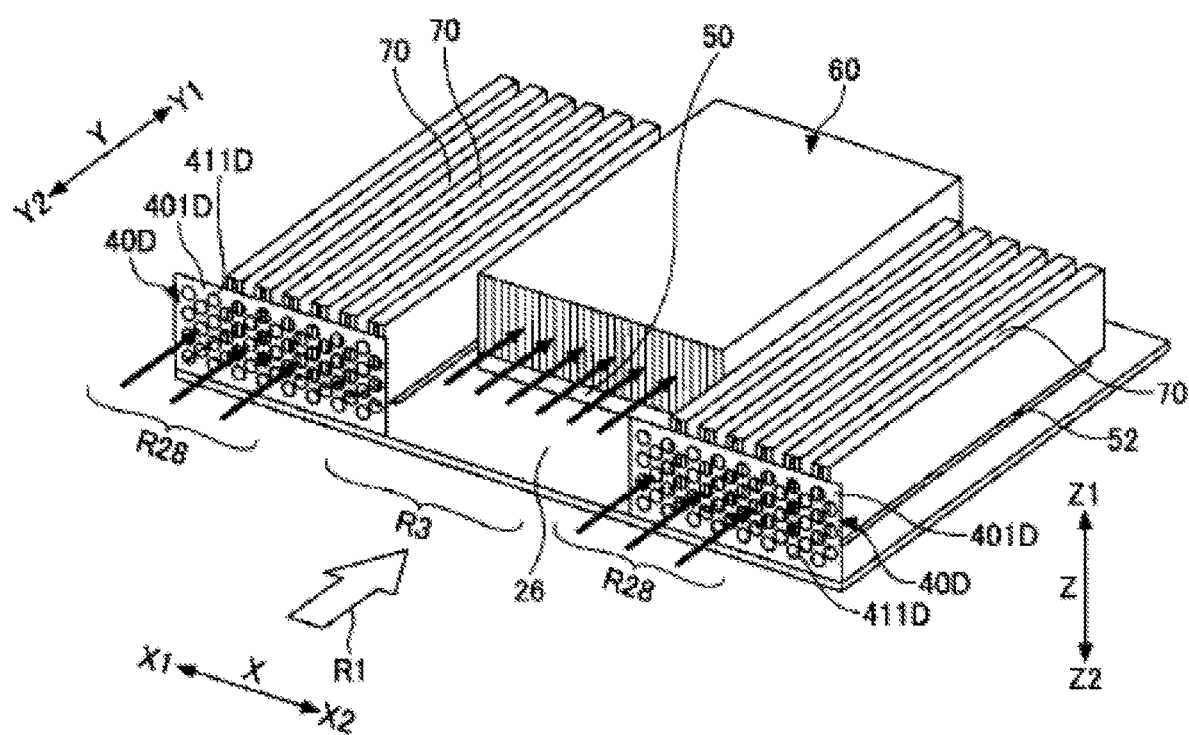
FIG. 37 is an explanatory view of the configuration and the effect of the flow rate adjusting structure according to example 5.
Figure 38:
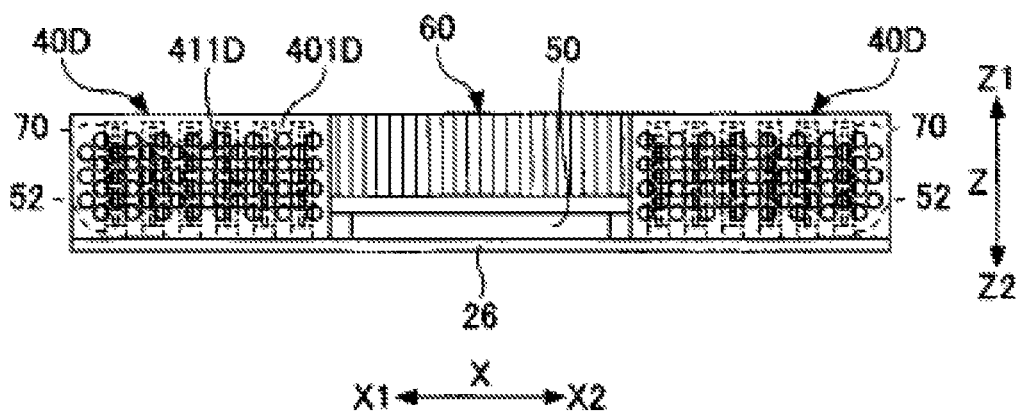
FIG. 38 is an explanatory view of the configuration and the effect of the flow rate adjusting structure according to example 5.

FIGS. 35 to 38 are explanatory views of the configuration and effect of a flow rate adjusting structure 40D according to example 5, in which the front side of a front wall portion 401D of the single unit case 20 is omitted. FIGS. 35 and 37 are partial perspective views, and FIGS. 36 and 38 are front views. FIGS. 35 and 36 illustrate a state in which no additional electronic component 70 is mounted, and FIGS. 37 and 38 illustrate a state in which all the additional electronic components 70 are mounted on the second region S2.

A flow rate adjusting structure 40D according to example 5 is different from the flow rate adjusting structure 40 according to example 1 described above in that the rear wall portion 402 and the side wall portion 404 are removed and the front wall portion 401 is replaced by the front wall portion 401D. The flow rate adjusting structure 40D includes the side member 22 (not illustrated) similarly to example 1 described above.

The front wall portion 401D includes a plurality of circular through-holes 411D (an example of the opening) for allowing air to flow on the second region S2. A through-hole 411D may perform the same function as the through-hole 411 according to example 1 described above.

In this manner, the same effect as that of example 1 described above may be obtained also by example 5.

However, since the flow rate adjusting structure 40D does not include the side wall portion 404 in example 5, in a state in which the additional electronic component 70 not mounted, the flow rate of air flowing into the second region S2 from between the front wall portion 401D and the electronic component 50 in the Y direction is generated (see the arrow R4 in FIG. 35). On the other hand, in the state in which the additional electronic component 70 is mounted, the flow rate of the air flowing into the second region S2 from between the front wall portion 401D and the electronic component 50 in the Y direction is reduced. Therefore, in example 5, compared with example 1 described above, the flow rate adjusting structure 40 D does not have the side wall portion 404, so the function of reducing the change in the cooling performance before and after addition of the additional electronic component 70 decreases. Also in example 5, the side wall portion 404 may be provided to reduce such inconvenience. Alternatively, in order to reduce such inconvenience, the mounted positions of the electronic component 50 and the heat sink 60 may be moved to the Y2 side in the Y direction up to the position of the front wall portion 401D.

As illustrated in FIG. 38, the through-hole 411D is also provided at a position where the through-hole 411D overlaps the additional electronic component 70 in the Y direction. Therefore, the flow rate of the air flowing onto the second region S2 through the through-hole 411D is slightly reduced as compared with the case where the through-hole is arranged so as not to overlap the additional electronic component 70 when viewed in the Y direction (see the arrow R28). In order to reduce such inconvenience, the through-hole 411D may be formed only between the connectors 52 in the X direction.

Each example has been described in detail above, but is not limited to a specific example, and various modifications and changes are possible within the scope described in the claims. It is also possible to combine all or a plurality of the constituent elements of the above examples.

For example, in the above example 1 (as well as other examples), the electronic device 1 is in a form of a server, but is not limited thereto. The present embodiment may also be applied to a smaller electronic device (for example, a unit electronic device realized by the unit case 20).

In addition, in the above example 1 (as well as other examples), the flow direction (a flow direction as a whole) of the cooling air in the substrate 26 is parallel to the Y direction, but is not limited thereto. The flow direction of the cooling air (a flow direction as a whole) in the substrate 26 may be a direction slightly inclined with respect to the Y direction.

In addition, in example 1 (as well as other examples), the flow rate adjusting structure 40 is preferably formed such that the cooling performance before and after addition of the additional electronic component 70 hardly change with respect to the function of reducing the change in the cooling performance before and after addition of the additional electronic component 70. For example, in the present specification, the phrase "hardly change" may be, for example, a concept in which the rate of change falls within 10%.

In addition, in a case of example 1 (as well as the other examples), the unit case 20 includes the side member 22 forming the flow rate adjusting structure 40, but not limited thereto. For example, in a case where the side member 12 of chassis 10 may perform the function of side member 22 as the flow rate adjusting structure 40, the side member 22 may be omitted. For example, in a case where the side member 22 of the unit case 20 and the side member 12 of the chassis 10 are arranged adjacent to each other in the X direction, the side member 22 may be omitted.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. An electronic device comprising:
    a first electronic component;
    a substrate on which the first electronic component is mounted, which includes an additional region formed on one side of the first electronic component in a first direction, which is a perpendicular direction to an insertion direction of the first electronic component, to add a second electronic component, and onto which cooling air flows; and
    a wall member which surrounds the additional region and includes a front wall portion, which extends in the first direction and is perpendicular to a surface of the substrate, a rear wall portion, which extends in the first direction, is perpendicular to the surface of the substrate and is parallel to the front wall portion on the other side of the additional region, and a side wall portion, which extends in the insertion direction perpendicular to the first direction, is perpendicular to the surface of the substrate and is coupled to a side of the front wall portion and a side of the rear wall portion,
    the side wall portion is arranged along a side wall of the first electronic component, each of the front wall portion and the rear wall portion of the wall member includes an opening for allowing the air to flow over the additional region and the side wall portion of the wall member includes no opening.

2. The electronic device according to claim 1, wherein another first wall portion is formed so as to be oppositely positioned to the front wall portion by holding the additional region between the another first wall portion and the front wall portion.

3. The electronic device according to claim 1, further comprising: a fan that flows the air.

4. The electronic device according to claim 3, wherein the fan is formed in such a manner that a rotation axis is perpendicular to the first direction and parallel to the surface of the substrate.

5. The electronic device according to claim 3, the opening is formed in such a manner that a relationship between a flow rate of the air supplied to the first electronic component and the flow rate of the air flowing over the additional region hardly change before and after the addition of the second electronic component onto the additional region.

6. The electronic device according to claim 3, wherein the opening is formed in such a manner that a flow rate of the air flowing over the additional region is hardly changed before and after the addition of the second electronic component onto the additional region.

7. The electronic device according to claim 1, wherein the additional region includes a plurality of installation areas for the second electronic component separated in the first direction from each other, and the respective openings are formed between the installation areas adjacent in the first direction.

8. The electronic device according to claim 7, wherein the opening area of one opening is equal to or less than a cross-sectional area of an air flow path formed between the second electronic components in a case where each second electronic components is mounted in the adjacent installation areas.

9. The electronic device according to claim 7, wherein the total opening area of the openings in the wall member is equal to or less than a total cross-sectional area of the air flow path formed between the second electronic components in a case where each second electronic components is mounted.

10. The electronic device according to claim 7, wherein the substrate includes a connector for the second electronic component in the installation area.

11. The electronic device according to claim 1, wherein the opening is in a form of a rectangular shape in which a dimension in a direction perpendicular to the surface of the substrate is larger than a dimension in the first direction.

12. The electronic device according to claim 1, wherein a part of the wall member is erected on the substrate.

* * * * *